(12) United States Patent
Sasaki et al.

(10) Patent No.: US 6,301,184 B1
(45) Date of Patent: Oct. 9, 2001

(54) SEMICONDUCTOR INTEGRATED CIRCUIT DEVICE HAVING AN IMPROVED OPERATION CONTROL FOR A DYNAMIC MEMORY

(75) Inventors: Toshio Sasaki, Mizuho; Yoshihiko Yasu, Koganei; Kazumasa Yanagisawa; Yuji Tanaka, both of Kokubunji; Toshiaki Takahira; Yasuto Igarashi, both of Kodaira; Mariko Ohtsuka, Kokubunji; Yasunobu Aoki, Tachikawa, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/480,695

(22) Filed: Jan. 11, 2000

(30) Foreign Application Priority Data

Jan. 11, 1999 (JP) .................................. 11-003902

(51) Int. Cl.[7] ...................................................... G11C 8/00
(52) U.S. Cl. .......................................... 365/226; 365/228
(58) Field of Search ................................ 365/230.03, 226, 365/228, 227, 229

(56) References Cited

U.S. PATENT DOCUMENTS 5,734,927 * 3/1998 Boutaud ........................... 365/189.01
6,088,762 * 7/2000 Creta ..................................... 365/226

FOREIGN PATENT DOCUMENTS 8204140   8/1996 (JP) .............................. H01K/27/04
8274620  10/1996 (JP) ............................. H03K/19/084
9186565   7/1997 (JP) .............................. H03K/17/04

* cited by examiner

Primary Examiner—A. Zarabian
(74) Attorney, Agent, or Firm—Antonelli, Terry, Stout & Kraus, LLP

(57) ABSTRACT

A DRAM module is applied to the system LSI which is provided with a standby mode for suppressing the whole operation thereof and an operation standby mode which permits at least the DRAM module to operate but suppresses the operation of other circuits. The above-mentioned modes as well as a substrate bias control technology are applied to the CMOS system LSI that operates on a low voltage. The system LSI is controlled to hold or not to hold data, enabling a memory of a large capacity to be mounted and consuming a sufficiently decreased amount of electric power.

11 Claims, 23 Drawing Sheets

FIG. 7

| INPUT CONT. SGL. | | | OPERATION MODE | |
|---|---|---|---|---|
| mq | pmq | resb | READ/WRITE OPERATION | INITIALIZE POWER SOURCE |
| 0 | 0 | 0 | NORMAL OPERATION MODE (1ST MODE) | RESET |
| 0 | 0 | 1 | NORMAL OPERATION MODE (1ST MODE) / NORMAL OPERATION | ACTIVATE INITIAL OPERATION resb (0→1) OR mq (1→0) |
| 0 | 1 | 0 | OPERATION STANDBY MODE (3RD MODE) | RESET |
| 0 | 1 | 1 | OPERATION STANDBY MODE (3RD MODE) / REFRESHING OPERATION | ACTIVATE INITIAL OPERATION resb (0→1) OR mq (1→0) |
| 1 | X  X; DON'T CARE ('1' OR '0') | | COMPLETE STANDBY MODE (2ND MODE) | |

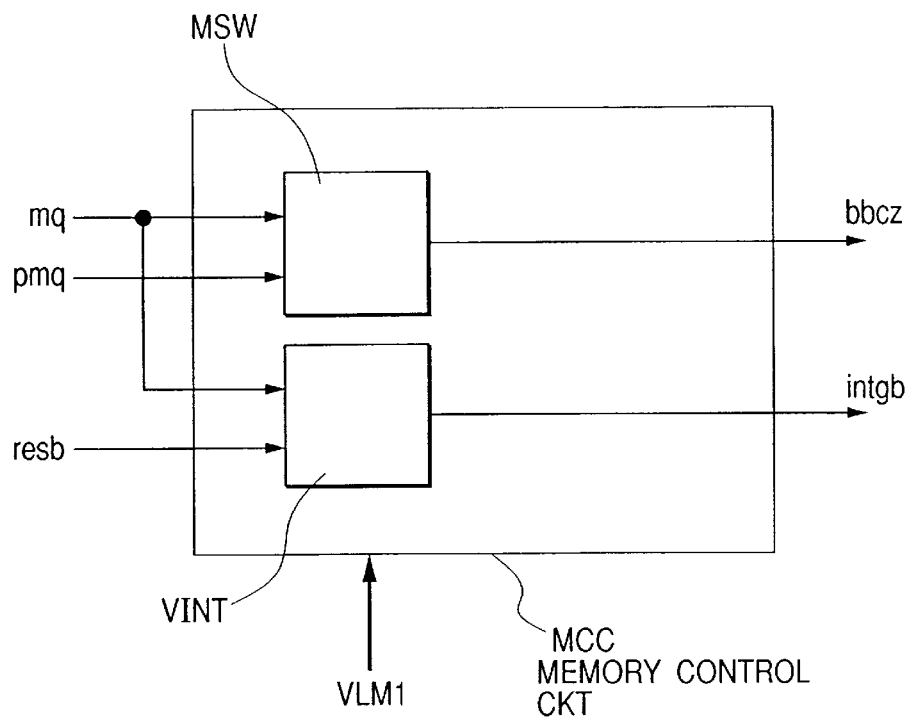

RST : RESET SGL.

| | NORMAL OPERATION MODE | STANDBY MODE |
|---|---|---|
| RESET SGL. | 0 | 1 |
| vbm | vdd/2 | HiZ |
| vpl | vdd/2 | HiZ |

SEMICONDUCTOR INTEGRATED CIRCUIT DEVICE HAVING AN IMPROVED OPERATION CONTROL FOR A DYNAMIC MEMORY

FIELD OF THE INVENTION

The present invention relates to a semiconductor integrated circuit device. More particularly, the invention relates to operation control technology or power source control technology adapted to a semiconductor integrated circuit device in which a dynamic semiconductor memory that can be regarded as a module or a functional unit is integrally constituted as a semiconductor integrated circuit device together with modules or functional units, such as a data processing circuit, based on CMOS circuit technology.

BACKGROUND OF THE INVENTION

Technology related to semiconductor integrated circuitry has been vigorously advancing in recent years, and even those constitutions that were not technically feasible are now drawing consideration. For example, modern applications for multi-media technology are demanding high-speed processing of great amounts of data even in cell-powered portable data terminal equipment (or a portable data terminal-system), as well as a decrease in the size and a weight and decrease in the amount of power consumption thereof. In order to meet these demands, it can be considered to mount the data processing circuits, such as a logic operation circuit and a central processing circuit, as well as a memory circuit of a relatively large capacity coupled to such a data processing device, on a single semiconductor substrate (chip) instead of constituting them as independent semiconductor integrated circuit devices. When the electronic system that is to be obtained further requires other functional circuits, such as an analog-digital converter circuit and a digital-analog converter circuit, such functional circuits, too, may be mounted on one semiconductor substrate.

In this case, it is convenient to treat the data processing circuit, memory circuit, analog-digital converter circuit, digital-analog converter circuit and the like circuits as individual modules or functional unit circuits from the standpoint of designing and producing a semiconductor integrated circuit-device. Therefore, the above-mentioned method can be regarded to be a method of mounting a plurality of different modules or functional units on a single semiconductor substrate.

The semiconductor integrated circuit device which has a constitution in which a plurality of modules having different functions are mounted on a semiconductor substrate may be considered to constitute almost all circuit portions of a desired electronic system and may, hence, be referred to as a system LSI. After the completion of the present invention, the present inventors have learned, through a search, of the presence of JP-A-8-204140, which is related to the substrate bias voltage control technology of the present invention that will be described later. According to the subject matter disclosed in this publication, the substrate bias voltages corresponding to the circuit blocks are controlled depending on the normal operation and the standby operation in the CMOS constitution that uses a silicon-on-insulator substrate. This publication, however, has no description concerning technology that can be favorably adapted to a plurality of modules or the mode-setting technology contemplated by the present invention as will be described later.

SUMMARY OF THE INVENTION

The semiconductor integrated circuit device on which a plurality of such modules are mounted employ fine wires, such as signal lines of decreased lengths, owing to the structure as a semiconductor integrated circuit device, making it possible to increase the operation speed of the electronic systems, to decrease the amount of electric consumption and to increase the resistance against noise. Besides, the number of wires connecting the modules can be freely increased without being limited by the number of external terminals provided for the semiconductor integrated circuit device, making it possible to realize a constitution for creating new functions that could not be realized by the combination of a plurality of semiconductor integrated circuit devices.

A read/write memory or a volatile memory mounted on a semiconductor substrate can be represented by a dynamic memory module, i.e., a memory module, the memory cells of which comprise a dynamic memory. A dynamic memory is constituted by memory cells of a relatively small size. Therefore, a dynamic memory as a whole is constituted in a relatively small size, and yet it has a large storage capacity. This makes it possible to realize an electronic system that could hardly be accomplished by using a memory such as a static memory constituted by memory cells of a relatively large size, which is far from having a large storage capacity unless it is constructed to have a large size.

In constituting the semiconductor integrated circuit device that can be regarded as a system LSI, it becomes important to satisfy various characteristics, such as operation functions to be realized by the electronic system, the operation speed and the power consumption, as well as to control the electric power to a sufficient degree in a substantially de-energized state, such as the standby state. That is, in a substantially de-energized state of the semiconductor integrated circuit device, such as the standby state, it is desired that the electric power is consumed in amounts as small as possible. Such a power control becomes particularly important in an electronic system such as portable information terminal equipment using cells as a power source.

It is therefore an object of the present invention to provide an operation control technology adapted to a semiconductor integrated circuit device mounting a data processing circuit and a dynamic memory.

Another object of the present invention is to provide operation control technology adapted to a CMOS semiconductor integrated circuit device mounting a data processing circuit and a dynamic memory.

A further object of the present invention is to provide an operation control technology adapted to a CMOS semiconductor integrated circuit device mounting a data processing circuit and a dynamic memory, which operates on a low power source voltage.

A still further object of the present invention is to provide a semiconductor integrated circuit device capable of decreasing the amount of consumption of electric power while holding the stored data.

A yet further object of the present invention is to provide a semiconductor integrated circuit device adapted as an ASIC (application specific integrated circuit).

A further object of the present invention is to provide bias control technology adapted to a system LSI (large scale integration).

Another object of the present invention is to provide a functional unit or a module constitution technology adapted to bias control.

A further object of the present invention is to provide a dynamic memory that serves as a functional unit or a module in the system LSI.

A yet further object of the present invention is to provide a semiconductor integrated circuit device that contributes to diversifying the electronic systems.

A still further object of the present invention is to provide operation control technology capable of avoiding effects that are not desired for the operation for holding the stored data.

A further object of the present invention is to provide a semiconductor integrated circuit device that reduces the difficulty for supplying power.

Still further objects and features of the present invention will become obvious from the description provided in the specification and from the accompanying drawings.

A representative example of the invention disclosed in this application will be briefly described below. The semiconductor integrated circuit device can be controlled in three modes. A first mode is one that can be regarded as a normal operation mode or an active mode, in which internal circuits, such as a data processing circuit and a memory circuit, are energized.

A second mode is one that can be regarded as a standby mode or a completely standby mode, in which the internal circuits are de-energized. In the second mode, the internal circuits, such as a data processing circuit and a dynamic memory, are de-energized and, hence, consume electric power in small amounts. A CMOS static memory constituted by CMOS static memory cells, that is mounted on the semiconductor substrate, may continue to hold the stored data in the second mode. The CMOS static memory of this type holds the data while consuming a very small operation current, as is well known.

A third mode is one regarded as an operation standby mode, in which the control circuit is energized for refreshing the dynamic memory and other circuits are de-energized. In the third mode, as required, the internal circuits constituting the dynamic memory are de-energized, such as those not related to the refreshing operation, like column decoder circuits and input/output circuits for the bus lines. In the third mode, required data are held in the dynamic memory. Therefore, the third mode can also be regarded as a sleep mode. It is desired that the above-mentioned three modes are instructed by two kinds of operation control signals. In this case, the three modes are instructed by the combinations of the two kinds of operation control signals.

The operation control signals for setting (shifting) the modes may be directly supplied from an external unit to the semiconductor integrated circuit device by providing the semiconductor device with external terminals exclusively for the operation control signals. As required, further, the operation control signals may be supplied as a command to common terminals such as data terminals of the semiconductor integrated circuit device, and may be formed or regenerated in the semiconductor integrated circuit device as a decoded result of command in the semiconductor integrated circuit device. There is no need of imposing a limitation on the meanings of the two kinds of operation control signals for the control operation. As required, meaningful modes may be defined by combining the two kinds of operation control signals. on the other hand, it is also allowable to impart independent meanings, such as using one of the two kinds of signals as an entire operation control signal and using the other signal as a partial operation control signal. In a relative sense, the latter proposal is more desired since the control operation for the electronic system can be easily managed depending on the independent meanings of the @ration control signals.

When the semiconductor integrated circuit device is constituted by a CMOS semiconductor integrated circuit device comprising chiefly a logic circuit operated by clock signals, the de-energized state in the second mode and in the first mode is brought about by suppressing the supply of clock signals to the circuits that are to be de-energized. When the semiconductor integrated circuit device includes an analog circuit that defines a current value and a voltage value to lie on desired levels by utilizing the operation resistances of the circuit elements, the operation switch control technology is adapted to the analog circuit.

When the semiconductor integrated circuit device is constituted by a CMOS semiconductor integrated circuit device that can be operated on a low power source voltage, the control operation for energizing and de-energizing the circuit in the first to third modes includes an operation for controlling the substrate bias voltages of the P-channel MOSFETs and the N-channel MOSFETs constituting the CMOS. According to the thus constituted control operation, the semiconductor integrated circuit device in the CMOS semiconductor integrated circuit device that operates on a low power source voltage, works so as to satisfy the desired functions and operation speed under normal operation conditions, and consumes a sufficiently decreased amount of electric power under the complete standby condition and under the operation standby condition. The operation on a low power source voltage means a decrease in the amplitude of the signals given to the circuit nodes in the semiconductor integrated circuit device.

A decrease in the amplitude of signals substantially shortens the transition period at the time when a signal changes from a low level into a high level or from a high level into a low level, and is effective in increasing the speed of operation of the circuit. Further, a decrease in the amplitude of signals decreases the current required for charging and discharging the wiring capacity and floating capacity on the circuit nodes. Thus, the operation on a low power source voltage is effective in increasing the operation speed of the circuit and in decreasing the consumption of electric power. The operation on a low power source voltage further makes it possible to use a power source having a relatively low voltage, such as cells. This is more suited for portable electronic systems.

The second mode is the standby mode where the electric power is consumed in small amounts. The semiconductor integrated circuit device may include a dynamic memory. In this case, when the refreshing operation is not conducted according to the second mode, the dynamic memory substantially ceases to operate and no longer holds the data. Upon giving attention to this memory operation, therefore, the second mode may be regarded as a memory quit mode. In this case, the operation control signal that designates the second mode can be regarded as a memory quit signal.

The circuit that can be substantially regarded to be a static memory, such as static memory or register of flip-flop constitution, is capable of holding data in the de-energized state. A memory quit signal can be distinguished from a signal for reset control such as reset signal. Similarly, the third mode can be regarded as a partial quit mode. The operation control signal for designating the partial quit mode can be regarded as a partial quit signal.

In the above description, the term "MOS" should be comprehended to be an abbreviation that stands for a metal oxide semiconductor constitution. In recent years, however, MOS generally includes those constitutions in which the metal in an essential part of the semiconductor device is replaced by an electric conductor such as polysilicon that is not a metal or in which an oxide is replaced by another insulator. CMOS, too, is acquiring a broad technical meaning accompanying a change in the comprehension of MOS. MOSFET, too, should not be comprehended to have a narrow meaning but should be comprehended to include a broad constitution which can be substantially regarded as an insulated-gate field-effect transistor. The terms CMOS and MOSFET according to the present invention comply with general designations.

BRIEF DESCRIPTION OF THE DRAWINGS

FIG. 7 is a diagram showing modes of operation of the semiconductor integrated circuit device of FIG. 1;

FIG. 9 is a diagram illustrating a major circuit in a circuit block MCC of FIG. 8;

FIG. 10 is a diagram illustrating the correspondence between the modes and the voltages assumed by the dynamic memory of FIG. 8;

DESCRIPTION OF THE PREFERRED EMBODIMENTS

The semiconductor integrated circuit device according to various embodiments of the present invention will now be described with reference to FIGS. 1 to 31.

(Whole Block Constitution)

Figure 1:
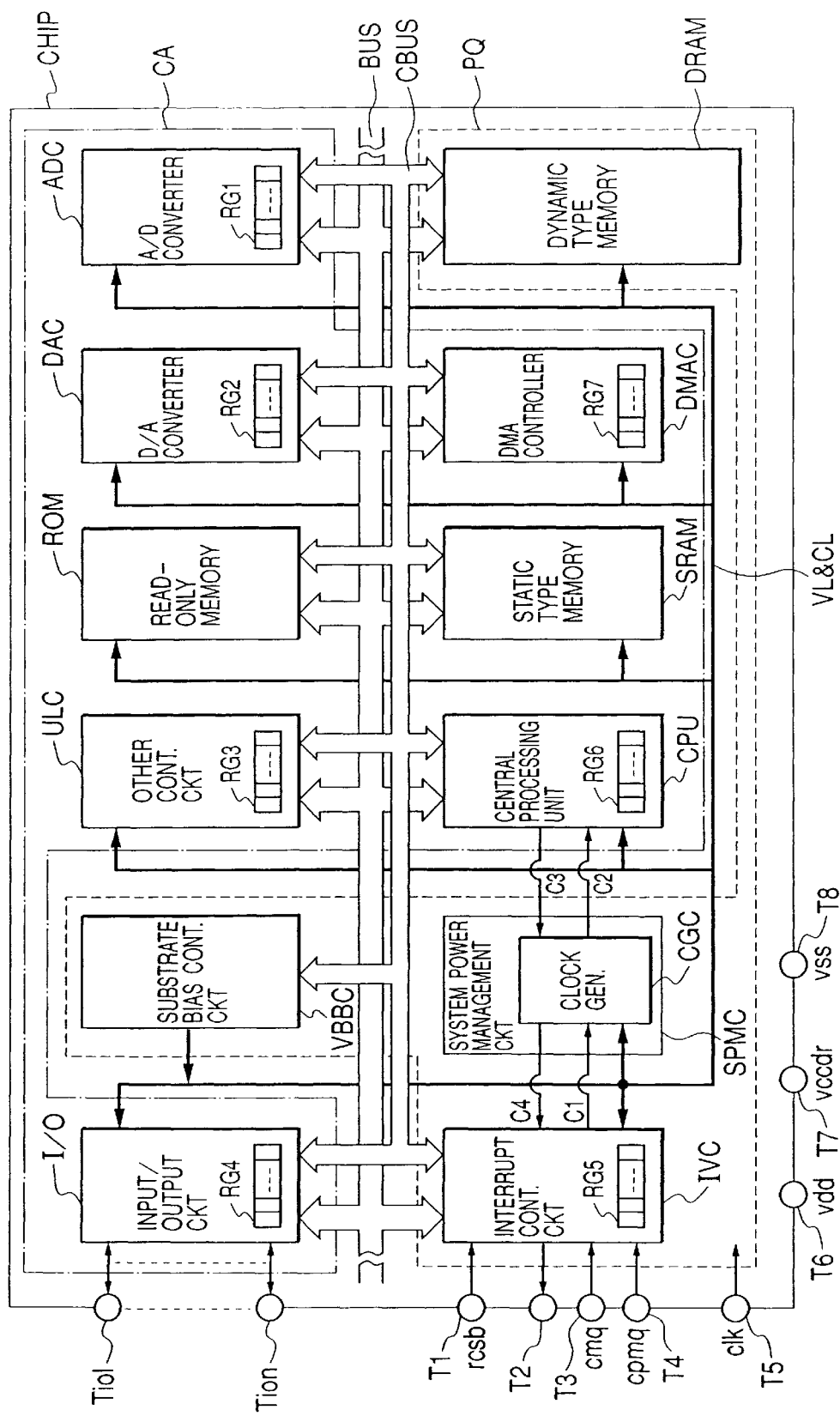
FIG. 1 is a block diagram illustrating the whole circuit of a semiconductor integrated circuit device according to an embodiment of the present invention.

FIG. 1 is a block diagram illustrating the whole circuitry of the semiconductor integrated circuit device according to an embodiment of the present invention. The semiconductor integrated circuit device CHIP of the embodiment includes a plurality of circuit blocks, i.e., an input/output circuit I/O, a substrate bias control circuit VBBC, a control circuit ULC, a read-only memory ROM, a D/A converter DAC, an A/D converter ADC, an interrupt control circuit IVC, a system power management circuit SPMC having a clock-generating circuit CGC, a central processing unit CPU, a static memory SRAM, a DMA controller DMAC, and a dynamic memory DRAM.

The circuit blocks are coupled to an internal bus BUS and a control bus CBUS. The circuit blocks are mounted on a semiconductor substrate that is not shown to constitute the semiconductor integrated circuit device. The system power management circuit SPMC has a function for controlling the electric power consumed by the modules mounted on the system LSI.

The semiconductor integrated circuit device includes input/output external terminals Tio1 to Tion connected to the input/output circuit I/O, an external terminal T1 supplied with a reset signal resb such as negative logic level, an external terminal T2 for control, an external terminal T3 supplied with a first operation control signal cmq for controlling the first operation, an external terminal T4 supplied with a second operation control signal cpmq for controlling the second operation, an external terminal T5 supplied with an external clock signal clk, and a plurality of external terminals T6, T7, T8 supplied with a plurality of power source voltages (vdd, vccdr, vss).

Though there is no particular limitation, the power source voltage vdd is used for operating the internal circuit blocks and assumes a value such as 1.8 volts±0.15 volts. The power source voltage vccdr is set chiefly for the input/output circuit I/O depending on the input/output level required for the semiconductor integrated circuit device, and assumes any one of 3.3 volts±0.3 volts, 2.5 volts±0.25 volts or 1.8 volts±0.15 volts. The potential vss is a so-called earth potential which is a reference potential of the circuit.

The semiconductor integrated circuit device shown in the drawing constitutes a so-called ASIC (application specified integrated circuit), i.e., constitutes an IC for a special use. That is, most of the circuit blocks that are shown are in the form of so-called modules or macrocells working as independent functional circuit units to facilitate the ASIC constitution. Each functional unit can be changed for its scale and constitution. In the ASIC including the circuit blocks that are shown, those circuit blocks that are not required by the electronic system to be realized may not be mounted on the semiconductor substrate. Conversely, circuit blocks of functional units that are not shown may be added.

Though there is no particular limitation, the semiconductor integrated circuit device may be one having a CMOS structure that operates on a low power source voltage vdd such as 1.8 volts±0.15 volts to exhibit sufficient operation characteristics.

The dynamic memory mounted on the semiconductor integrated circuit device may be operated by the above-mentioned power source voltage vdd. For driving the dynamic memory, however, the semiconductor integrated circuit device of this embodiment uses, in addition to the power source voltage vdd, a high power source voltage generated by a voltage-generating circuit that is driven by the power source voltage vdd. In the dynamic memory, circuits such as row decoders for selecting the dynamic memory cells are operated by the high power source voltage, and circuits for inputting/outputting signals relative to the internal bus BUS of the semiconductor integrated circuit device are operated by a power source voltage such as low power source voltage vdd. This constitution increases the amount of electric charge that serves as data and is given to the dynamic memory cells. This enables the dynamic memory to exhibit good data holding time characteristics.

(Central Processing Unit CPU)

Though there is no particular limitation, the central processing unit CPU is constituted in the same manner as a so-called microprocessor. Though not diagramed in detail, the central processing unit CPU includes an instruction register, a micro-instruction ROM for decoding an instruction written into the instruction register and for forming various micro-instructions or control signals, an operation circuit, a general-purpose register (RG6, etc.), input/output circuits, such as a bus driver, and a bus receiver coupled to the internal bus BUS.

The central processing unit CPU reads an instruction stored in the read-only memory ROM and operates to comply with the instruction. The central processing unit CPU receives the external data input through the input/output circuit I/O, reads the data such as fixed data necessary for inputting and outputting data relative to the control circuit ULC and for executing the instruction from the read-only memory ROM, supplies data to the D/A converter DAC so as to be subjected to D/A conversion, reads the data subjected to the A/D conversion through the A/D converter, reads and writes data from and into the static memory SRAM and dynamic memory DRAM, and controls the operation of the DNA controller DMAC. The control bus CBUS is used for controlling the operations of the circuit blocks by the central processing unit CPU, and for transmitting the state instruction signals from the circuit blocks, such as the DMA controller DMAC, to the central processing unit CPU.

The central processing unit CPU makes a reference, via the internal bus BUS, to an operation control signal set to an instruction register RG 5 in the interrupt control circuit IVC, to execute the required processing. The operation and mode instructed, which depend on the external operation control signal, will be described later in detail with reference to the logic circuit CLC of FIG. 6 and the functional diagram of FIG. 7.

Upon receiving system clock signals C2 generated from the clock-generating circuit CGC, the central processing unit CPU operates to maintain an operation timing and a period determined by the system clock signals C2.

The central processing unit CPU is chiefly constituted by a CMOS circuit, i.e., a circuit constituted by PMOS and NMOS. Though there is no particular limitation, the CMOS circuit constituting the central processing unit CPU includes a CMOS static logic circuit, a CMOS static circuit capable of undergoing static operation, such as CMOS static flip-flop, and a CMOS dynamic circuit that precharges the signal output node and outputs a signal to the signal output node in synchronism with the system clock signals C2.

The central processing unit CPU ceases to operate when the system clock signal C2 is no longer supplied from the clock-generating circuit CGC. In the ceased state, the output signal of the dynamic circuit undesirably changes due to undesired leakage current produced in the circuit. The circuit, such as the register circuit having a static flip-flop circuit constitution, continues to hold the data even when it is not supplied with the system clock signal.

In the period in which no system clock signal C2 is supplied, no signal level changes at the nodes of the static circuit in the central processing unit CPU, and no discharge or precharge takes place at the output node of the dynamic circuit. In this state, a relatively large current that is being consumed, such as the operation current consumed by the CMOS circuit that is in operation, becomes substantially zero, i.e., a charge or discharge current from the power source line becomes substantially zero so as to impart signal displacement to the floating capacity and parasitic capacity possessed by the nodes and by the wires connected to the nodes. Therefore, only a small current, such as one equal to the leakage current in the CMOS circuit, flows into the central processing unit CPU to establish a state of low power consumption.

(Interrupt Control Circuit IVC)

The interrupt control circuit IVC receives through its external terminal T1 a reset signal, such as a negative logic level, receives through its external terminal T3 a first operation control signal cmq, receives through its external terminal T4 a second operation control signal cpmq, and outputs through its external terminal T2 a state instruction signal for instructing the operation state of the semiconductor integrated circuit device. The interrupt control circuit IVC has a register RG5 to which the bits of positions can be set corresponding to the reset signal resb, operation control signals cmq, cpmq and a state instruction signal. The state instruction signals will be described later in detail with reference to FIG. 6.

The state instruction signal in the register RG5 is updated by the central processing unit CPU through the internal bus BUS. The operation control signals cmq and cpmq, which are set to the register RG5 through the external terminals T3 and T4, are referred to by the central processing unit CPU through the internal bus BUS.

Though there is no particular limitation, the interrupt control circuit IVC includes a refresh address counter that is not shown for refreshing the dynamic memory. When the first and third modes are instructed by the first and second operation control signals cmq and cpmq, i.e., when the operation mode or the operation standby mode is instructed for the semiconductor integrated circuit device, the refresh address counter in the interrupt control circuit IVC is stepped up based on the system clock signal from the clock-generating circuit CGC to form refresh address data that is periodically updated.

(Clock-Generating Circuit CGC)

The clock-generating circuit CGC receives an external clock signal clk through the external terminal T5, and forms a system clock signal C2 of a period corresponding to the external clock signal clk. In FIG. 1, signal lines are expressed in a simplified manner between the clock-generating circuit CGC and the central processing unit CPU. It should, however, be noted that the system clock signals C2 are in the form of multi-phase signals like clock signals for a general processor for creating orderly operations of the circuits (not shown) in the central processing unit CPU.

Generation of the system clock signals C2 by the clock-generating circuit CGC is controlled by a control signal C1 such as mode signal MODE2 or initial operation instruction signal INTL (see FIG. 6) that responds to the first and second operation control signals cmq and cpmq from the interrupt control circuit IVC, and by a control signal C3 from the central processing unit CPU. When the complete standby operation is instructed by the operation control signal cmq, the central processing unit CPU executes the processing operation necessary for shifting into the complete standby operation inclusive of the processing operation for writing data to be statically held into the static memory SRAM. Then, the central processing unit CPU sends a control signal C3 to the clock-generating circuit CGC in order to halt the operation for generating the system clocks.

When the operation standby is instructed by the operation control signal cpmq, the central processing unit CPU executes the processing operation necessary for shifting into the operation standby inclusive of the processing operation for writing data to be statically held into the static memory SRAM in the game manner as the above-mentioned complete standby operation. unlike the above-mentioned complete standby operation, in this case, the subsequent operation works to send a control signal C3 from the central processing unit CPU to the clock-generating circuit CGC in order to selectively output the system clock signals.

That is, the system clock signals are continuously supplied from the clock-generating circuit CGC to the interrupt control circuit IVC and to the dynamic memory DRAM, but are not supplied to other circuit blocks. When the operation control signals cmq and cpmq are changed into a state to instruct the operation of the circuit, the clock-generating circuit CGC is controlled by the control signal C1 from the interrupt control circuit IVC so as to generate the system clock signal C2 that corresponds to the external clock signal clk.

(Input/Output Circuit I/O)

The input/output circuit I/O receives a signal from an external unit through a desired external terminal among the external terminals Tio1 to Tion, and receives, through the internal bus BUS, a signal to be output to a desired terminal among the external terminals Tio1 to Tion. The input/output circuit I/O includes a control register RG4 and a data register that is not shown, which are constituted by CMOS static circuits.

The control register RG4 is selected by the central processing unit CPU and receives, from the central processing unit CPU, the control data for the input/output circuit I/O, such as the one for instructing data input/output operations or for instructing the high output impedance state. The data register is used for transferring data between the external terminals Tio1 to Tion and the internal bus BUS. When the bit width of the external terminals Tio1 to Tion, i.e., the number of the terminals, is different from the bit width of the internal bus BUS, the data register is allowed to have a bit number that corresponds to a large bit width, and the bit number is changed by the operation controlled by the central processing unit CPU.

When the number of the external terminals Tio1 to Tion is, for example, 64 while the bit width of the internal bus BUS is as relatively large as 256 bits, the serial data that are successively supplied to the external terminals Tio1 to Tion with a unit of 64 bits, are successively supplied to the data register through series-parallel data conversion by the central processing unit CPU, and are converted into data of 256 bits. Conversely, the data of 256 bits set to the data register from the internal bus BUS are successively supplied to the external terminals Tio1 to Tion being divided every 64 bits through the parallel-series data conversion control operation by the central processing unit CPU.

The circuit for inputting signals and the circuit for outputting signals in the input/output circuit I/O are controlled as to their input and output operations by the system clock signals. When the system clock signal is no loner supplied, therefore, the input/output circuit I/O acquires a state of low power consumption like the above-mentioned central processing unit CPU.

(Control Circuit ULC)

The control circuit ULC is suitably provided as required by the electronic system. As the control circuit ULC, there can be suitably provided a motor servo control circuit in a hard-disk device, a circuit for controlling the tracking of the head, an error correction circuit, or a video and voice data compression/expansion circuit in the video and voice processing, depending upon the electronic system that is to be obtained. Like the central processing unit CPU, the control circuit ULC is controlled for its operation by a system clock signal.

(Read-Only Memory ROM)

The read-only memory ROM stores instructions and fixed data to be read out and executed by the central processing unit CPU as described earlier.

(D/A Converter DAC)

The D/A converter DAC has a register RG2 that receives, through the internal bus BUS, digital data to be converted into analog signals, and forms the analog signals based on the digital data. To the register RG2. are set digital data by the control circuit ULC or the central processing unit CPU. The D/A conversion operations such as the D/A conversion start timing of the D/A converter DAC and the D/A converted result output timing, are controlled by the system clock signal. Though there is no particular limitation, the analog signal formed by the D/A converter DAC is supplied to a desired terminal among the external terminals T1 to Tn through the internal bus BUS and the input/output circuit I/O. Here, the external terminals T1 to Tn serve as input/output terminals (pins), which, however, may be separated into input terminals and output terminals.

Though not diagramed in detail, when a D/A conversion of high precision is required, the D/A converter DAC is provided with a reference voltage source or a reference current source that serves as a reference for the analog quantity to be obtained. It is regarded that the reference voltage source or the reference current source constitutes an analog circuit which may consume an electric current to a degree which is no longer negligible in the second mode and third mode, i.e., in the complete standby mode and the operation standby mode. In order to decrease the consumption of electric current in such a case, therefore, the reference voltage source or the reference current source is provided with a MOSFET switch that is turned off in the second mode and in the third mode.

(A/D Converter ADC)

The A/D converter ADC receives analog signals through a desired terminal among the external terminals T1 to Tn, and through the input/output circuit I/O and the internal bus BUS, and is controlled for its start of A/D conversion by the control circuit ULC or the central processing unit CPU, converts the analog signals into digital signals being controlled by block signals that comply with the system clock signals C2, and sets the obtained digital signals to the register RG1.

When an AD conversion of high precision is required, the A/D converter ADC, too, is equipped with a reference voltage source or a reference current source that serves as a reference for the quantization level that is to be converted into a digital quantity, like the above-mentioned D/A converter DAC. The reference voltage source or the reference current source in the A/D converter ADC, too, may consume an electric current to a degree that is no longer negligible in the complete standby mode and in the operation standby mode. Therefore, a MOSFET switch similar to the one described above is provided for the reference voltage source or the reference current source.

(Static Memory SRAM)

Though the details are not diagramed, the static memory SRAM has CMOS static memory cells, i.e., memory cells which are so arranged as to constitute a CMOS latch circuit and a pair of transfer gate MOSFETs for inputting and outputting data relative thereto. The CMOS static memory cell has a feature in that it statically holds the data requiring only a very small operation current for holding the data.

The static memory SRAM substantially constitutes CMOS static random access memory. That is, the static memory SRAM includes a memory array comprising a plurality of CMOS static memory cells arranged in the form of a matrix, a row address decode drive circuit which decodes a row address signal supplied through the internal bus BUS and selects a word line in the memory array, a column address decode circuit which decodes a column address signal and forms a column decode signal, a column switch circuit which is operated by the column decode signal, selects a data line in the memory array and couples it to a common data line, an input/output circuit coupled to the common data line, and a read/write control circuit.

The circuit, such as an address decode drive circuit, i.e., memory array peripheral circuit related to the memory array, is constituted by a CMOS static circuit. Therefore, the static memory SRAM is placed in a state of consuming a relatively small amount of electric power when it is simply holding the data without reading or writing data. The CMOS static memory employs memory cells of a size which is relatively large and, hence, its overall size becomes relatively large compared to its storage capacity, making it difficult to obtain a large storage capacity.

(DMA Controller DMAC)

The DMA controller or the direct memory access controller DMAC is controlled for its operation by the central processing unit CPU, and controls the transfer of data among the circuit blocks instructed by the central processing unit CPU through the internal bus BUS on behalf of the central processing unit CPU. The DMA controller DMAC can be constituted substantially in the same manner as the DMA controller that is constitilt6d as an independent semiconductor integrated circuit device, and is not described here in detail. Here, however, the DMA controller DMAC controls the transfer of data to the register RG7 incorporated therein, based on the data related to the source of transfer, data related to the destination of transfer and the data related to the amount of data transfer set by the central processing unit CPU.

(Dynamic Memory DRAM)

The dynamic memory DRAM can be constructed to have a relatively small size, since each memory cell or dynamic memory cell is typically constituted by a small number of elements, which include a capacitor for storing data in the form of an electric charge and comprise selection MOSFETS. Therefore, the dynamic memory as a whole can be constructed to have a relatively small size despite its large storage capacity.

Since the dynamic memory DRAM can be constituted to have a relatively small size despite its large storage capacity, the semiconductor substrate mounting it together with other circuit blocks may have a relatively small size. Therefore, a corresponding advantage can be expected. That is, the size of the semiconductor substrate affects the electric properties of the semiconductor integrated circuit device to be obtained, the reliability concerning thermal and mechanical stress, the yield of products, the cost and the like, and satirizes the design objective of the smaller the better. Upon mounting a memory of a large capacity together with a plurality of circuit blocks on the semiconductor substrate of a relatively small size, one is able to provide a semiconductor integrated circuit device that makes it possible to realize an electronic system having an excellent performance.

The dynamic memory DRAM substantially constitutes a CMOS dynamic random access memory. Details of the constitution of the dynamic memory DRAM will be described later with reference to FIG. 8. MOSFETs that can be regarded to be substantially power source switches are included in the power source circuit and in the substrate bias voltage-generating circuit that are provided in the dynamic memory that will be described later. When the complete standby operation is instructed by the first operation control signal cmq, the MOSFET that can be regarded to be the power source switch is turned off to shut off the outputs of the power source circuit and the substrate bias voltage-generating circuit, and to shut off the operation current thereof.

(Outline of Operation of the Circuit Device)

When the complete standby operation is instructed by the first operation control signal cmq supplied to the external terminal T3, the semiconductor integrated circuit device having the constitution shown in FIG. 1 no longer generates the system clock signal C2, since the clock-generating circuit CGC is not operating, and is placed as a whole in the state of a low power consumption.

When operation standby is instructed by the second operation control signal cpmq fed to the external terminal T4, the circuit portion related to the operation for refreshing the dynamic memory is placed in operation due to the selective output of the clock-generating circuit CGC. However, many of the circuit blocks that are shown are placed in the de-energized state. Accordingly, the semiconductor integrated circuit device is placed in the state of a relatively small power consumption.

The present inventors have discovered the fact that the semiconductor integrated circuit device of this embodiment requires a sufficiently decreased amount of operation current for refreshing the dynamic memory DRAM owing to the structure of the device, advanced technology concerning the production process and owing to the contrivance of the invention that will be described below, and that the operation standby can be realized even with a power source having a relatively small amount of electric power such as cells. Therefore, the semiconductor integrated circuit device of this embodiment can be put into practice to a sufficient degree in contrast with the generally accepted idea that a fairly large amount of electric power is consumed by a dynamic memory DRAM for continuing the refreshing operation for holding the data.

(Characteristics of the Low-Voltage CMOS Circuit Device)

The semiconductor integrated circuit device having a CMOS structure according to this embodiment operates on a low power source voltage as described above. As is well known, therefore, the power source voltage for the circuit and the threshold voltage of the MOSFET must be set to main a relationship between each other. That is, in order to realize the circuit operation maintaining characteristics, such as a desired operation speed at a desired power source voltage, the threshold voltage of the MOSFET must be set to be sufficiently lower than the power source voltage.

In order for the CMOS circuit to operate on a low power source voltage, it is necessary to set to small values the threshold voltage (hereinafter often abbreviated as Vth) of the P-channel MOSFET (hereinafter often abbreviated as PMOS) and the threshold voltage of the N-channel MOSFET (hereinafter often abbreviated as NMOS) that constitute the CMOS circuit.

In the semiconductor integrated circuit device of this embodiment, the P-channel MOSFET and the N-channel MOSFET provided on the semiconductor substrate to constitute the CMOS circuit are both of the enhancement mode, and have threshold voltages which are as small as −0.15 volts and +0.15 volts. When the threshold voltages of the nMOS and pMOS are set to small values as described above, however, a leakage current that is not negligible, called a tailing current or sub-threshold leakage current, flows through the NMOS and PMOS even when the gate potential of the NMOS is set to a minimum potential directly determined by the external power source, such as the ground potential of the circuit, or even when the gate potential of the PMOS is set to a maximum potential directly determined by the external power source such as the power source voltage level or, in other words, even when the nMOS and pMOS are turned off. When the threshold voltage is as low as 0.15 volts as described above and when there are employed several thousands to several tens of thousands of MOSFETs through which the leakage current may flow, then, the sub-threshold leakage current becomes as great as, for example, from 20 to 200 µA.

(Substrate Bias Voltage Control Technology)

The leakage current of the above-mentioned type can be decreased by increasing the effective threshold voltage based on the so-called substrate bias effect. In this embodiment, in order to favorably control the CMOS semiconductor integrated circuit device that can be operated on a low power source voltage, provision is made of a substrate bias control circuit VBBC as shown in FIG. 1. The substrate bias control circuit VBBC includes a voltage-generating circuit constituted by a charge pumping circuit that operates on an external power source voltage supplied to the semiconductor integrated circuit device and a rectifier circuit, and forms positive and negative bias voltages in excess of the range of the external power source voltage and further forms a substrate bias control signal.

(Substrate Bias Control Circuit VBBC)

The substrate bias control circuit VBBC is substantially constituted as a single circuit block like other circuit blocks that are in the form of modules or functional units.

The semiconductor integrated circuit device is provided with wirings VL and CL connected to the substrate bias control circuit VBBC and to the circuit blocks. The wirings VL and CL include a plurality of power source lines for supplying a variety of substrate bias potentials to the substrate of the MOSFETs (insulated gate field-effect transistors) constituting the circuit blocks, as well as signal lines for supplying a variety of control signals for setting the modes of the circuit blocks.

(CMOS Structure for Controlling the Substrate Bias)

As will be described later in detail with reference to FIGS. 14 and 15, the semiconductor integrated circuit device, if briefly described, assumes a structure in which a P-type well region and an N-type well region are provided in the semicohaabtor substrate CHIP of single crystalline silicon, the P-type well region having formed therein, an N-channel MOSFET using this region as a substrate gate and the N-type well region having a P-channel MOSFET formed therein using this region as a substrate gate.

In this embodiment, as will become obvious from the following description, it is essential that the CMOS circuit that is to be de-energized and the CMOS circuit that is to be energized are present simultaneously, that a P-channel MOSFET that assumes a deep substrate bias state and a P-channel MOSFET that assumes a shallow substrate bias state are present, and that an N-channel MOSFET that assumes the deep substrate bias state and an N-channel MOSFET that assumes the shallow substrate bias state are present. In other words, the substrate gate of the P-channel MOSFET that will assume the deep substrate bias state must be electrically independent of the substrate gate of the P-channel MOSFET that will assume the shallow substrate bias state. Similarly, the substrate gate of the N-channel MOSFET that will assume the deep substrate bias state must be electrically independent of the substrate gate of the N-channel MOSFET that will assume the shallow substrate bias state.

To accomplish such an electric independence according to this embodiment, there is employed a semiconductor isolation region technology that exhibits an excellent effect in protecting the memory cells in the dynamic memory from the leaking current source, such as a rays. That is, when a P-type semiconductor substrate is used as shown in FIG. 15, an N-type semiconductor isolation region niso is formed on the surface thereof. A plurality of separate P-type well regions are provided in the N-type semiconductor isolation region niso in order to realize different substrate biases. As required, further, a P-type well region is provided for each of the plurality of N-type semiconductor isolation regions that are separated from each other. In each P-type well region there is formed an N-channel MOSFET using the P-type well region as a substrate gate. Similarly, in order to realize different substrate biases, an N-type well region is provided in each of the plurality of separate N-type semiconductor isolation regions, and in each N-type well region there is formed a P-channel MOSFET using the N-type well region as the substrate gate.

In a broad sense, the substrate bias voltage can be comprehended to be a bias voltage applied across the source and the substrate gate of a MOSFET. From this point of view, even in a method of applying a bias voltage to the source of the MOSFET, the source bias voltage substantially brings about a substrate bias effect causing a change in the effective threshold voltage of the MOSFET. The present invention may employ a substrate bias control based on a change in the source potential. The method of controlling the source bias voltage may bring about relatively good response characteristics for the control, but, instead, the amplitude of the signal, such as the output signal of the circuit, decreases relative to the bias voltage.

The embodiment therefore deals with the constitution for controlling the potential of the substrate gate from the standpoint of effectively utilizing the power source voltage. That is, the substrate bias control circuit VBBC works to control the substrate gate potentials (substrate bias potentials) of the MOS transistors constituting the circuit blocks depending on a mode instructed by the first and second operation control signals cmq, cpmq.

Figure 2:
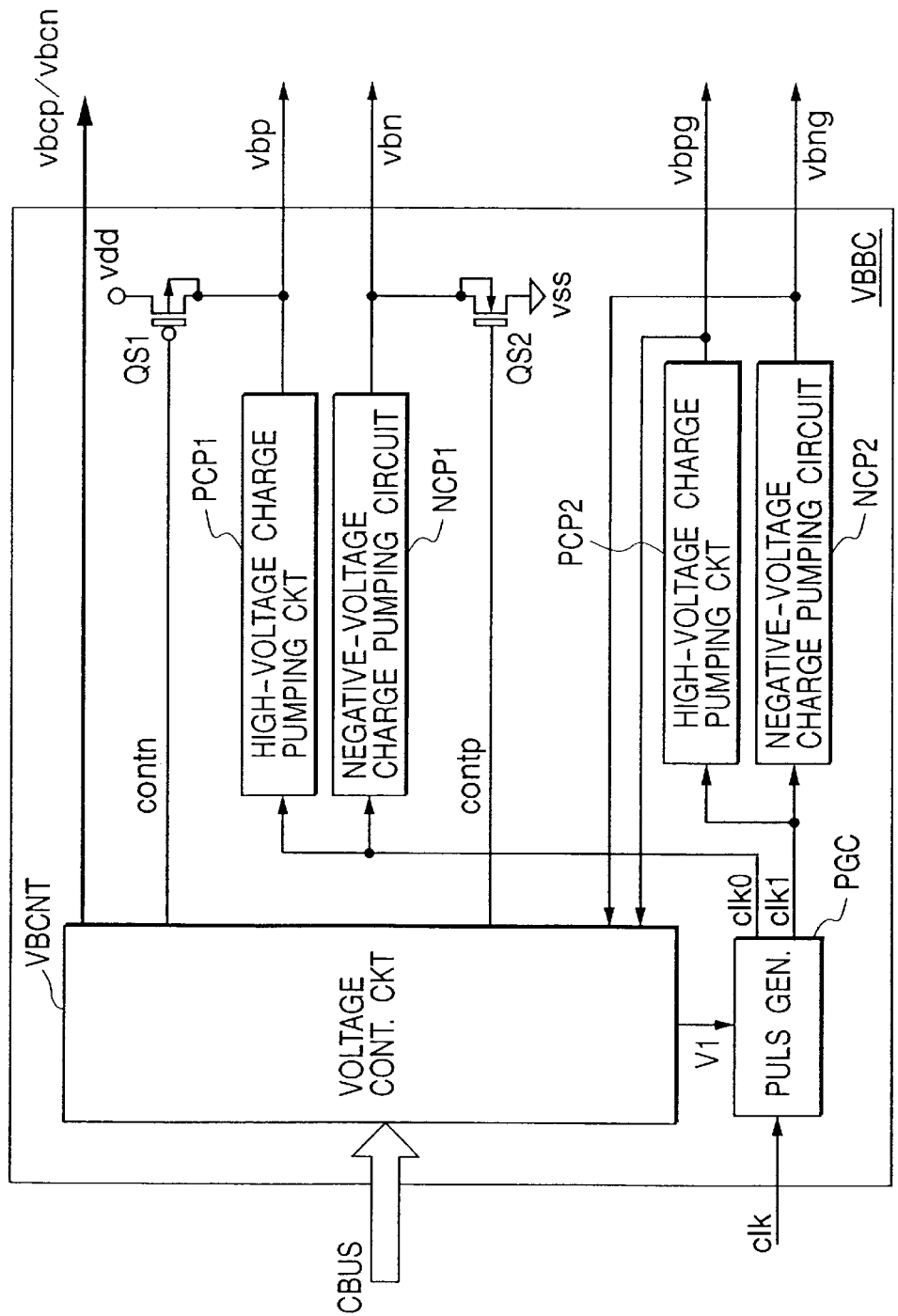
FIG. 2 is a block diagram illustrating in detail the internal portion of a substrate bias control circuit VBBC of FIG. 1.

FIG. 2 is a block diagram of a substrate bias control circuit VBBC. As shown, the substrate bias control circuit VBBC includes an operation control circuit VBCNT, a first high-voltage charge pumping circuit PCP1, a second high-voltage charge pumping circuit PCP2, a first negative voltage charge pumping circuit NCP1, a second negative voltage charge pumping circuit NCP2, a pulse-generating circuit PGC, and switching MOSFETs QS1 and QS2. The substrate bias control circuit VBBC as a whole is operated by the power source voltage vdd.

(Operation Control Circuit VBCNT)

The operation control circuit VBCNT receives a control signal that varies depending on the operation mode supplied via the control bus CBUS and forms a control signal V1 for controlling the operation of the pulse-generating circuit PGC. The operation control circuit VBCNT further receives an output voltage vbpg of a positive high voltage level such as 3.3 volts output from the second high-voltage charge pumping circuit PCP2, and an output voltage vbng of a negative voltage level such as −1.5 volts output from the second negative voltage charge pumping circuit NCP2, and forms control signals vbcp and cbcn of levels such as 3.3 volts and 1.5 volts.

The operation control circuit VBCNT forms switch control signals contn of the level vbp and the level vss for controlling the P-channel switching MOSFET QS1 depending on a control signal from the control bus CBUS, and forms switch control signals contp of the level vbn and the level vss for controlling the N-channel switching MOSFET QS2.

The first high-voltage charge pumping circuit PCP1 executes the charge pumping operation in response to a periodic pulse signal clko output from the pulse-generating circuit PGC, and forms a positive output voltage vbp of a level higher than the power source voltage vdd supplied thereto.

The relationship between the operation modes instructed to the semiconductor integrated circuit device and the levels of various bias voltages and control signals output from the substrate bias control circuit VBBC, will be fully comprehended from the description appearing later with reference to FIG. 10 that illustrates the operation for controlling the dynamic memory DRAM.

(Charge Pumping Circuit)

Figure 3:
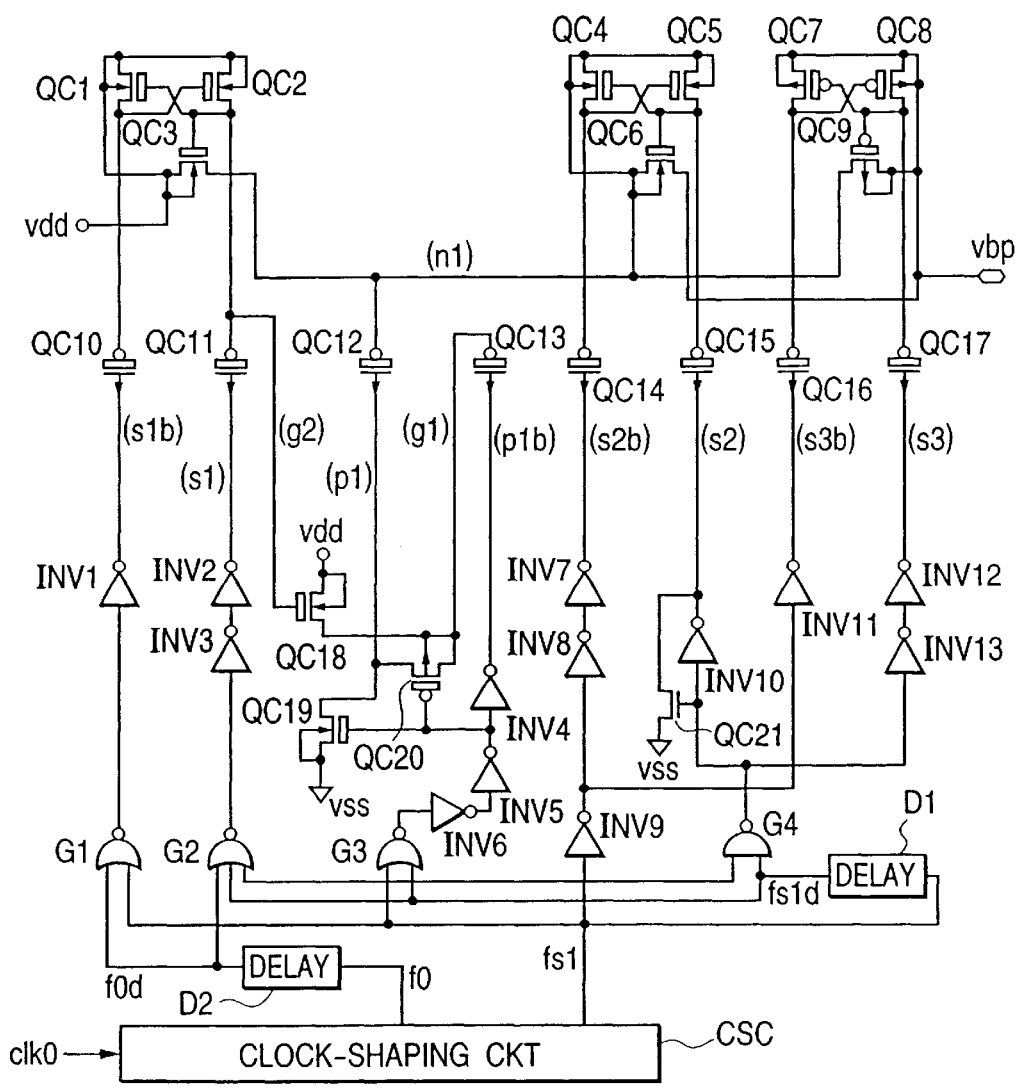
FIG. 3 is a circuit diagram of a first high-voltage charge pumping circuit PCP1 of FIG. 2.
Figure 4:
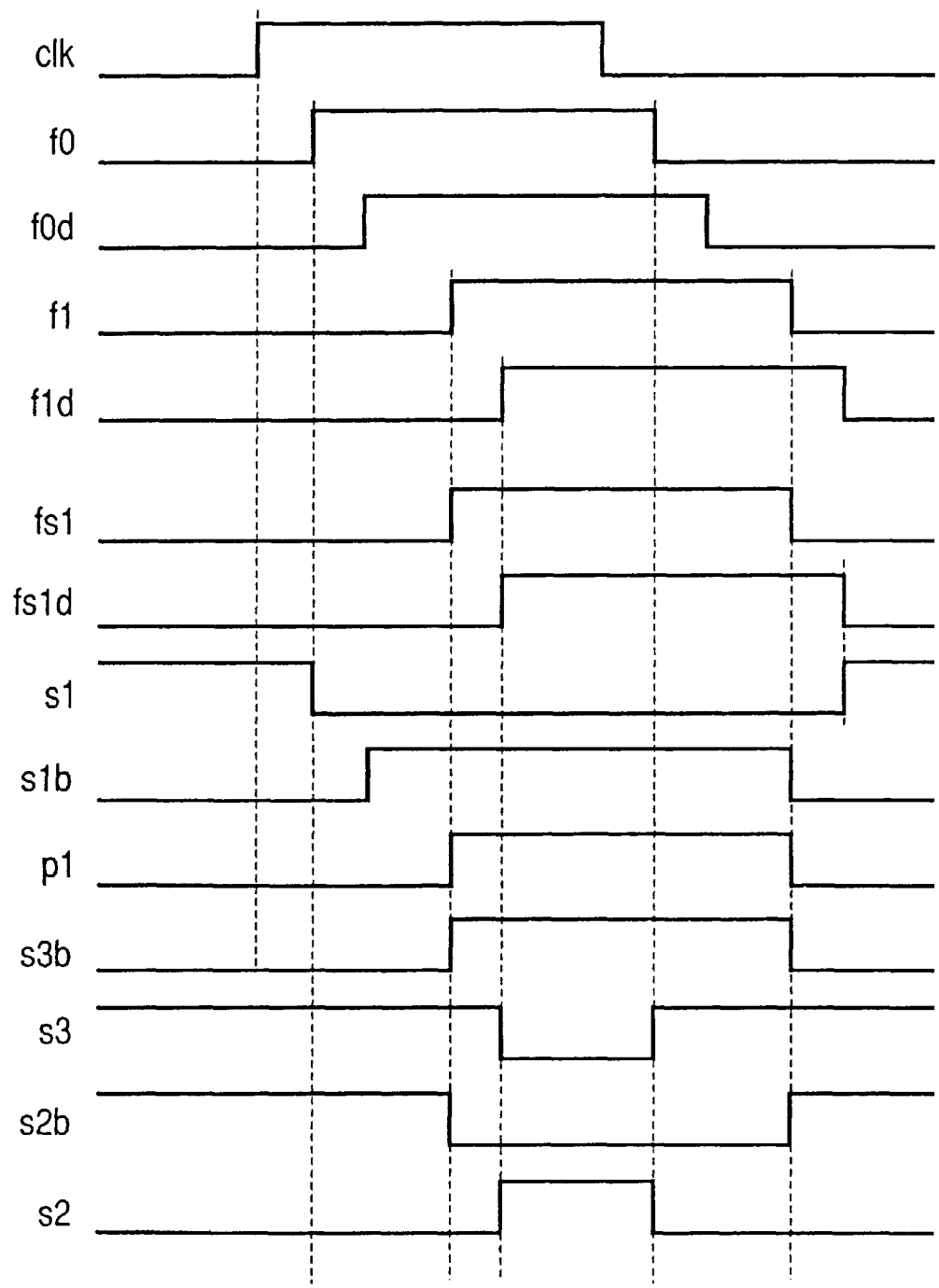
FIG. 4 is a timing chart of the first high-voltage charge pumping circuit PCP1 of FIG. 3.

FIG. 3 concretely illustrates the first high-voltage charge pumping circuit PCP1, and FIG. 4 is a timing chart therefor. The circuit PCP1 includes, as shown, a plurality of P-channel MOSFETs QC7 to QC9, N-channel. MOSFETS QC1 to QC6, capacitors QC12 and QC13 for charge pumps, high-voltage drive capacitors QC10, QC11, QC14 to QC17 at the transfer gates QC3, QC6, QC9, CMOS inverter circuits INVL to INV13, CMOS NOR gate circuits G1 to G4, delay circuits D1 and D2, and a clock-shaping circuit CSC.

Though there is no particular limitation, the MOSFETs such as QC1, QC7, etc., denoted by a wide gate symbol possess a gate-insulating film of a relatively large thickness and exhibit a sufficiently large gate breakdown voltage against a high voltage that is to be obtained. The MOSFETs such as QC21, etc., denoted by a narrow gate symbol have a relatively thin gate-insulating film so as to be adapted to the low power source voltage vdd like the MOSFETs constituting the circuit blocks of FIG. 1.

Though the circuit may appear to be complex to some extent, FIG. 3 illustrates an example thereof and its operation can be fully comprehended with reference to the timing chart of FIG. 4. This circuit does not constitute an essential part of the invention and is not described in further detail.

The second high-voltage charge pumping circuit PCP2 executes the charge pumping operation in response to a pulse signal clk1 output from the pulse-generating circuit PGC, and forms a positive output voltage vbpg of a level higher than the power source voltage vdd supplied thereto. Here, the first and second high-voltage charge pumping circuits PCP1 and PCP2 may be used in common. In this case, a switch should be provided between a terminal that outputs the output voltage vbp and a branch point of signal lines that output the output voltage vbp and the output voltage vbpg, so that the supply (output) of the fixed output voltage vbpg is maintained. The same can be said even for the first and second negative voltage charge pumping circuits NCP1 and NCP2.

The first negative voltage charge pumping circuit NCP1 of FIG. 2 executes the charge pumping operation in response to a pulse signal clkO output from the pusle-generating circuit PGC, and forms a negative output voltage of a level lower than the reference potential vss supplied thereto.

Figure 5:
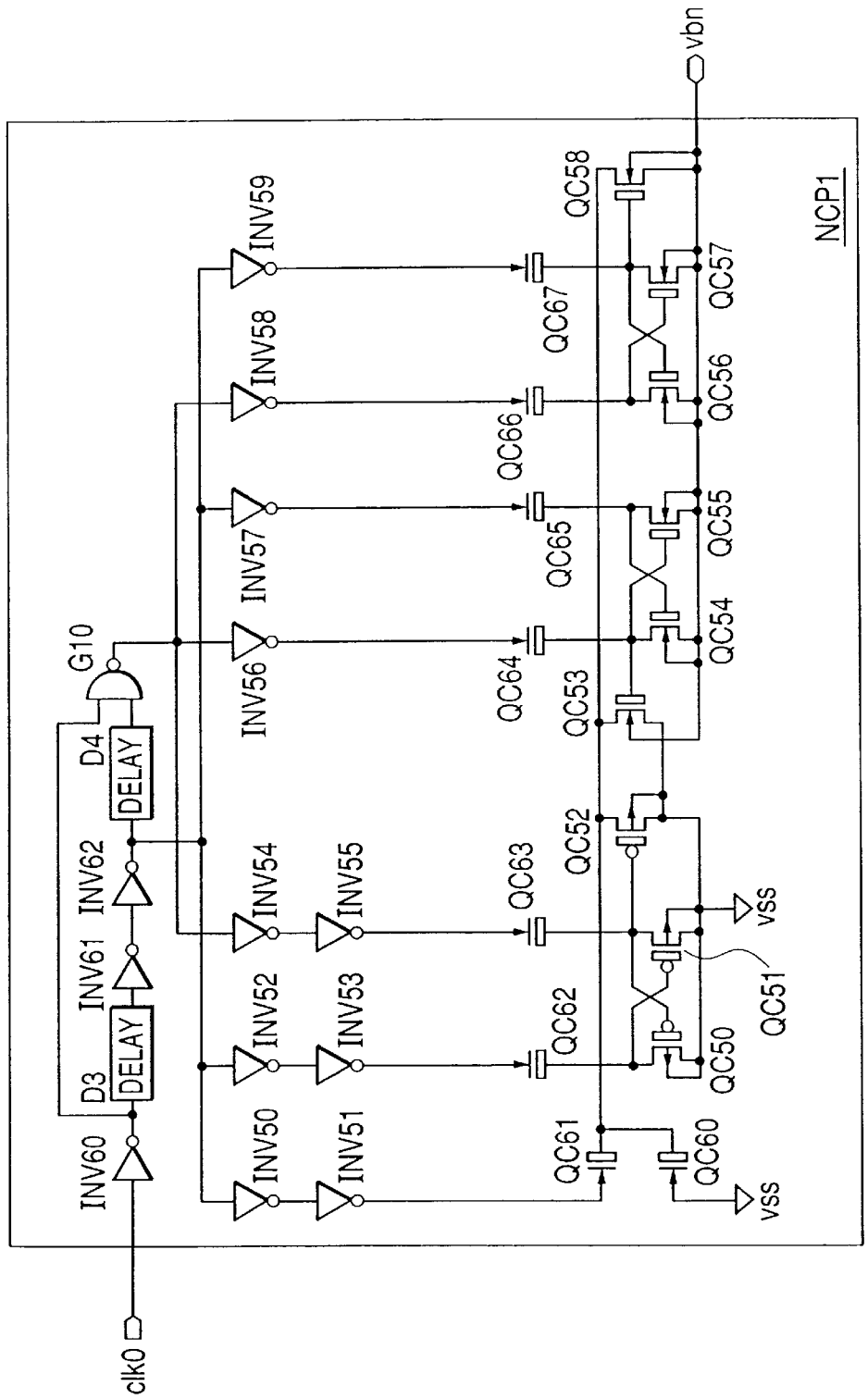
FIG. 5 is a circuit diagram of a first negative@.voltage charge pumping circuit NCP1 of FIG. 3.

FIG. 5 concretely illustrates the first negative voltage charge pumping circuit NCP1. Though this circuit, too, may appear to be complex to some extent, FIG. 5 illustrates an example thereof and its operation can be fully comprehended with reference to the circuit diagram thereof like the circuit shown in FIG. 3. Therefore, this circuit is not described in further detailed.

The second negative voltage charge pumping circuit NCP2 executes the charge pumping operation in response to a pulse signal clk1 output from the pusle-generating circuit PGC, and forms a negative output voltage vbng of a level lower than the reference potential vss supplied thereto.

(Pulse-Generating Circuit PGC)

In FIG. 2, the pulse-generating circuit PGC forms pulse signals clk0 and clk1 in response to an external clock signal clk supplied through the external terminal T5 shown in FIG. 1. The pulse-generating circuit PGC contains a frequency-dividing circuit for dividing the frequency of the external clock signals clk into ½ or ¼, and forms pulse signals clk0 and clk1. Decreasing the frequencies of the pulse signals clk0 and clk1 is effective in avoiding an event in which a relatively large current is consumed as the charge pumping circuits are operated at undesirably high frequencies.

The pulse signal clk0 for operating the first high-voltage charge pumping circuit PCP1 and the first negative voltage charge pumping circuit NCP1 is controlled for its formation by a control signal V1 output from the control circuit VBCNT. The pulse signal clk0 for operating the second high-voltage charge pumping circuit PCP2 and the second negative voltage charge pumping circuit NCP2 is a steady pulse signal formed in response to the external clock signal.

In FIG. 2, the switching MOSFET QS1 is provided for switching the output voltage vbp into a high-voltage level obtained by the charge pumping operation and into the power source voltage vdd level. That is, when the output voltage vbp is to be set to the shallow substrate bias voltage level due to the control signal supplied through the control bus CBUS, the voltage control circuit VBCNT produces the control signal V1 so that the pulse signal clk0 is no longer generated from the pusle-generating circuit PGC, thereby to discontinue the operation of the high-voltage charge pumping circuit PCP1. The voltage control circuit VBCNT further changes the control signal contn from the level vbp into the level vss.

When the control signal contn changes from the level vbp into the level vss, the switching MOSFET QS1 changes from the turned-off state into the turned-on state and produces the output vbp of a shallow bias level which is the level vdd. Similarly, the switching MOSFET QS2 is provided for changing the output voltage vbn into a negative voltage level obtained by the charge pumping operation and into the reference potential level vss. That is, when the output vbn is to be set to a shallow substrate bias voltage level, the voltage control circuit VBCNT discontinues the generation of the pulse signal clk0 from the pulse-generating circuit PGC as described above, and changes the control signal contp from the level vbn into the level vss in order to change the switching MOSFET QS2 from the turned-off state into the turned-on state. When the charge pumping circuits are used in common as described above, the pulse-generating circuit continues to generate the pulse signals clk0 and clk1 in order to maintain the supply (output) of the fixed output voltage vbpg.

(Grouping of Circuit Blocks)

In this embodiment, a plurality of circuit blocks are divided into a plurality of groups in order to more favorably control the substrate bias depending on the operation modes. One group (hereinafter referred to as group 1 or a first group of circuit blocks) includes various circuit blocks surrounded by a dot-dash line CA in FIG. 1, i.e., the input/output circuit I/O, control circuit ULC, read-only memory ROM, D/A converter DAC, A/D converter ADC, central processing unit CPU, static memory SRAM, and DMA controller DMAC. It can be considered that the group 1 permits, in the de-energized state, the internal signal level such as the output of the logic circuit not to be determined, and comprises circuit blocks inclusive of a holder circuit for holding the preceding signal level in a state where the register remains static or is halted.

The other group (hereinafter referred to as group 2 or second group of circuit blocks) includes the substrate bias control circuit VBBC, interrupt control circuit IVC, clock-generating circuit CGC and dynamic memory DRAM that are surrounded by a dotted line PQ in FIG. 1. The group 2 can be considered to include circuit blocks for controlling the energized state and de-energized state, and circuit blocks for operation standby.

(Controlling the Substrate Bias in each of the Modes)

The substrate bias is controlled by the substrate bias control circuit in a manner, for example, as described below.

(First Mode or Normal Operation Mode)

In the first mode which stands for the normal operation mode, the substrate bias potentials of the P-channel MOSFET and N-channel MOSFET are set to be the power source potential of the circuit and the ground potential of the circuit, respectively, or, in other words, are set to bring about a shallow substrate bias state in order to suppress as much as possible an increase in the effective threshold voltage due to the substrate bias effect in either the group 1 or the group 2. In this state, the MOSFETs operate to maintain predetermined operation characteristics due to the shallow substrate bias voltage. Accordingly, the circuits perform their predetermined operations. In this case, the leakage current of the above-mentioned kind may become relatively great but must be tolerated from the standpoint of operating the circuits to exhibit their respective operation characteristics.

(Second Mode or Standby Mode)

In the second mode which stands for the standby mode, a deep substrate bias voltage (substrate bias potential for increasing the threshold voltage of the transistor) is applied even to the substrate gates of the MOSFETs of either the group 1 or the group 2. That is, a relatively high positive bias potential is applied to the substrate gate of the P-channel MOSFET, and a relatively low negative bias potential is given to the substrate gate of the N-channel MOSFET. In the second mode, therefore, the sub-threshold leakage current can be decreased to a sufficient degree.

(Third Mode or Operation Standby Mode)

In the third mode which can be regarded to be the operation standby mode, the substrate gates of the MOSFETs in the circuit blocks of the group 2 are rendered to assume the shallow substrate bias state, and the substrate gates of the MOSFETs constituting other circuits are rendered to assume the deep substrate bias state. Therefore, the interrupt control circuit IVC responds to a change in the external control signal at a relatively high response speed, and is maintained in the energized state so as to form a refresh address signal for refreshing the dynamic memory DRAM. As the circuit portions related to the refreshing operation are placed in the energized state, the dynamic memory executes the refreshing operation maintaining a desired relatively quick refreshing period. other circuits in the group 1 are placed in the de-energized state where the sub-threshold leakage current is decreased to a sufficient degree.

Upon controlling the supply of the system clock signals relying on the first and second operation control signals cmq, cpmq and upon controlling the substrate bias potential as described above, the CMOS semiconductor integrated circuit device capable of operating on a low power source voltage exhibits not only excellent operation characteristics but also excellent performance such as low power consumption during the standby operation.

(Mode Control Circuit in the Interrupt Control Circuit IVC)

Figure 6:
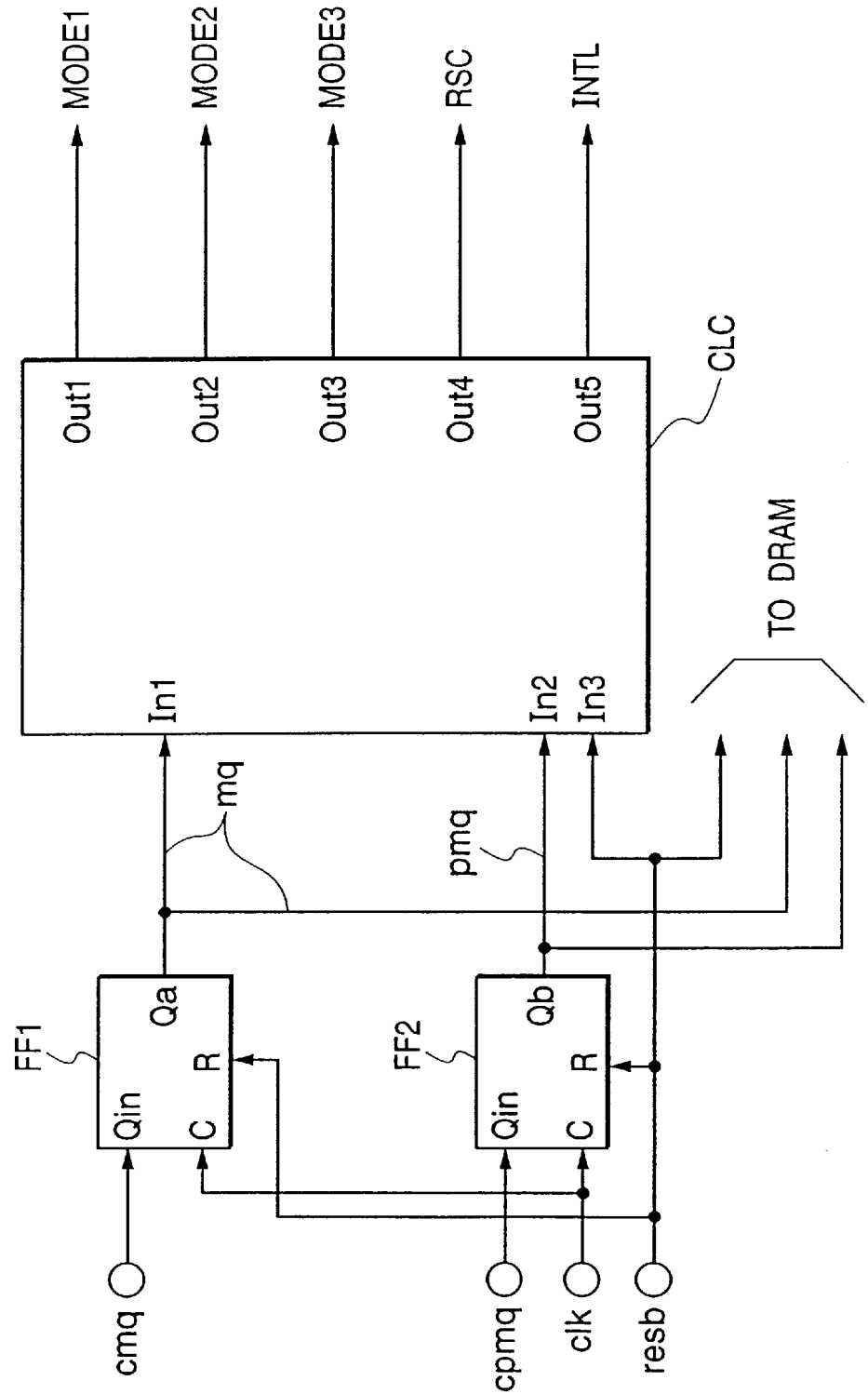
FIG. 6 is a circuit diagram illustrating a major circuit in the circuit block IVC of FIG. 1.

FIG. 6 is a circuit block diagram of a mode control circuit that receives operation control signals and forms various internal operation control signals as a result of decoding. Though there is no particular limitation, the diagramed control circuit is provided in the interrupt control circuit IVC.

In FIG. 6, FF1 and FF2 are input circuits for receiving first and second operation control signals cmq and cpmq from the external terminals T3 and T4 (see FIG. 1). The input circuits FF1 and FF2 substantially comprise flip-flop circuits that receive input signals through the data input terminals Qin in synchronism with the external clock signals clk supplied to the clock terminals c. Therefore, the output terminal Qa of the input circuit FFI produces an internal operation control signal mq which is substantially equal to the operation control signal cmq input from the external unit and is adjusted for its timing for the timing signal clk. Similarly, the output terminal Qb of the input circuit FF2 produces an internal operation control signal pmq which is substantially equal to the operation control signal cpmq input from the external unit and is adjusted for its timing for the timing signal clk.

The internal operation control signals mq and pmq are supplied to the dynamic memory and are further supplied to the control logic circuit CLC. To the logic circuit CLC there is further supplied a reset signal resb of the negative logic level through the external terminal T1. The control logic circuit CLC receives the signals mq, pmq, resb, and forms various instruction signals or control signals. The output signals from the control logic circuit CLC are supplied to the register such as the register RG5 in the interrupt control circuit IVC in FIG. 1.

Briefly speaking, the functions that should be performed by the control logic circuit CLC become as shown in FIG. 7. The output signals MODE1 to MODE3 from the first to third output terminals Out1 to out3 of the control logic circuit CLC serve as mode instruction signals, the output signal RSC of the external terminal Out4 serves as an internal reset signal, and the output signal INTL of the external terminal Out5 serves as an initial operation activation instruction signal.

When the internal signal mq has a non-significant level such as logic level 0 due to the logic level 0 of the first operation control signal cmq from the external terminal T3, either the first output terminal Out1 or the third output terminal Out3 is caused to acquire a significant level such as logic level 1 due to the internal operation control signal pmq. That is, when the internal operation control signal pmq has a nonsignificant level such as the logic level 0 due to the second external operation control signal cpmq from the external unit, the first output terminal Out1 assumes the significant level such as the logic level 1. Thus, the first mode or the normal operation mode is instructed. Conversely, when the internal operation control signal pmq has a significant level such as the logic level 1, the third output terminal Out3 assumes a significant level such as the logic level 1. Thus, the third mode or the operation standby is instructed.

While the external first operation control signal cmq is assuming a non-significant level, the fourth output terminal Out4 of the logic circuit CLC is determined as to its level by the external reset signal resb of the negative logic level. That is, when the reset signal resb is at a significant level which is the logic level 0, the fourth output terminal .Out4 is caused to acquire a reset level which is the logic level 1 in response thereto.

When at least either the signal mq or the signal resb is caused to assume the logic level 1 and is then caused to assume the logic level 0, the fifth output terminal Out5 of the logic circuit CLC is caused to assume a significant level such as the logic level 1 in response thereto. Though there is no particular limitation, the fifth output terminal Out5 is supplied as an initial operation activation instruction signal INTL to the dynamic memory DRAM and to the central processing unit CPU (see FIG. 1).

Setting the signal INTL includes the following technical meaning. That is, inputting the external reset signal resb means resetting the operation states of the circuits constituting the semiconductor integrated circuit device. As described earlier and as will be described below, the operation control signal mq causes the semiconductor integrated circuit device to be de-energized. In the de-energized state brought about by the operation control signal mq, the voltage-generating circuits such as the power source voltage-forming circuit and the bias voltage-forming circuit are de-energized in the semiconductor integrated circuit device, and the internal voltages formed by these circuits are placed in the de-energized level.

When the load-drive abilities based on these voltage-generating circuits are relatively small, a relatively extended period of time is required for the voltages formed by these circuits to change from the de-energized level into a steadily energized level. Therefore, the control based on the signal INTL offers a meaning for the circuit operation that requires a relatively extended period of time before the steady state is reached.

The central processing unit CPU executes the initial programming operation inclusive of initializing various registers incorporated therein in response to the signal INTL.

Though there is no particular limitation, the central processing unit CPU has a boot sequence which outputs an instruction signal to reset the initial operation activation instruction signal INTL from the operation instruction level. This is done by a signal intgb which is regarded to be a power source initialization operation instruction signal from the power source initialization circuit VINTC that is provided in the dynamic memory DRAM which will be described later and is illustrated in detail in FIG. 23. As required, the signal INTL may be reset from the operation instruction level upon the completion of the initial program operation of the central processing unit CPU.

When the first operation control signal cmq from the external unit is at a significant level such as the logic level 1, the control logic circuit CLC produces, through the second output terminal Out2, an output of a significant level such as logic level 1 based on the internal signal mq at that moment, irrespective of the states of the signals cmq and resb. Thus, the second mode or standby operation mode or complete standby operation mode is instructed. In this embodiment, the first operation control signal cmq specifies the state of the internal circuit irrespective of other signals and can, hence, be to be the most preferential operation control signal.

The control circuit of FIG. 6 provided in the interrupt control circuit IVC has the functions as described above with reference to FIG. 7, and works to control the timing to cope with a change in the bias voltage when the operation mode is shifted. The timing control of this kind is important for each of the circuit blocks shown in FIG. 1 and is most important, particularly, for the dynamic memory DRAM.

In the dynamic memory DRAM, data is stored in a data storage capacity of a very small capacitance in the dynamic memory cell. Therefore, erroneous operation may easily take place due to a slight change in the circuit operation conditions. As will be described later, further, the memory cell plate electrode and bit line form relatively large loads, and an extended period of time is required for a change toward the steady value of the potential.

In this embodiment, therefore, the timing control for a change in the bias voltage in the control circuit of FIG. 6 is substantially the one for the dynamic memory DRAM. The timing control will be understood from a timing chart of FIG. 11 related to the dynamic memory DRAM that will be described later.

Unlike the constitution that can be comprehended from the functional diagram only of FIG. 7, the control logic circuit CLC in the control circuit of FIG. 6 includes a timing control which takes into consideration a change in the bias voltage output from the substrate bias control circuit VBBC as will be obvious from the foregoing description. The timing control which takes the change in the bias voltage into consideration can be executed by a digital timer comprising a counter which starts the counting operation in response to the signals cmq, resb and counts the clock signals clk.

The timing can be controlled by providing a substrate voltage detection circuit comprising a first substrate voltage detection circuit that detects a positive substrate bias voltage supplied from the substrate bias control circuit VBBC that has reached a predetermined value, and a second substrate voltage detection circuit that detects a negative substrate bias voltage that has reached a predetermined value.

The constitution of the voltage detection circuit itself has no direct relationship to the present invention and is not diagramed here. However, the first substrate voltage detection circuit is constituted by, for example, a level conversion circuit that forms a level conversion output in a range of power source voltages vdd depending on the positive-substrate bias voltage, and a level judging circuit that is operated by the power source voltage vdd and judges the level of the level conversion output.

The level conversion circuit is constituted by a p-channel MOSFET that is diode-connected between a positive substrate bias output point and an output node, and a high-resistance N-channel MOSFET that serves as a bias current source from which an operation bias current flows between the output node and the reference potential point vss of the circuit in the operation state. The level judging circuit is constituted by an inverter circuit or a CMOS Schmidt circuit. Similarly, the second substrate voltage detection circuit is constituted by a level conversion circuit that comprises a high-resistance P-channel MOSFET serving as an operation bias current source provided between the power source vdd and a negative substrate bias output point and a diode-connected N-channel MOSFET, and a level judging circuit that receives the output thereof.

The first and second substrate voltage detection circuits may be energized upon the start of level judgement and may be de-energized upon the end of level judgement instead of being constructed so that the high-resistance MOSFETs in their respective level conversion circuits are always operated. Therefore, the substrate voltage detection circuit is de-energized when the operation current bias source is de-energized, and is placed in the state of a low power consumption.

The latter constitution that utilizes the detection output of the substrate voltage detection circuit directly detects the substrate bias voltage that has reached a predetermined value, and controls the timing based on the detection output and, hence, makes it possible to conduct the control operation more suitably and at a relatively early timing irrespective of a change in the transition characteristics of the substrate bias voltage caused by a change in the operation temperature of the semiconductor integrated circuit device.

(Details of the Dynamic Memory DRAM)

(Overall Constitution)

Figure 8:
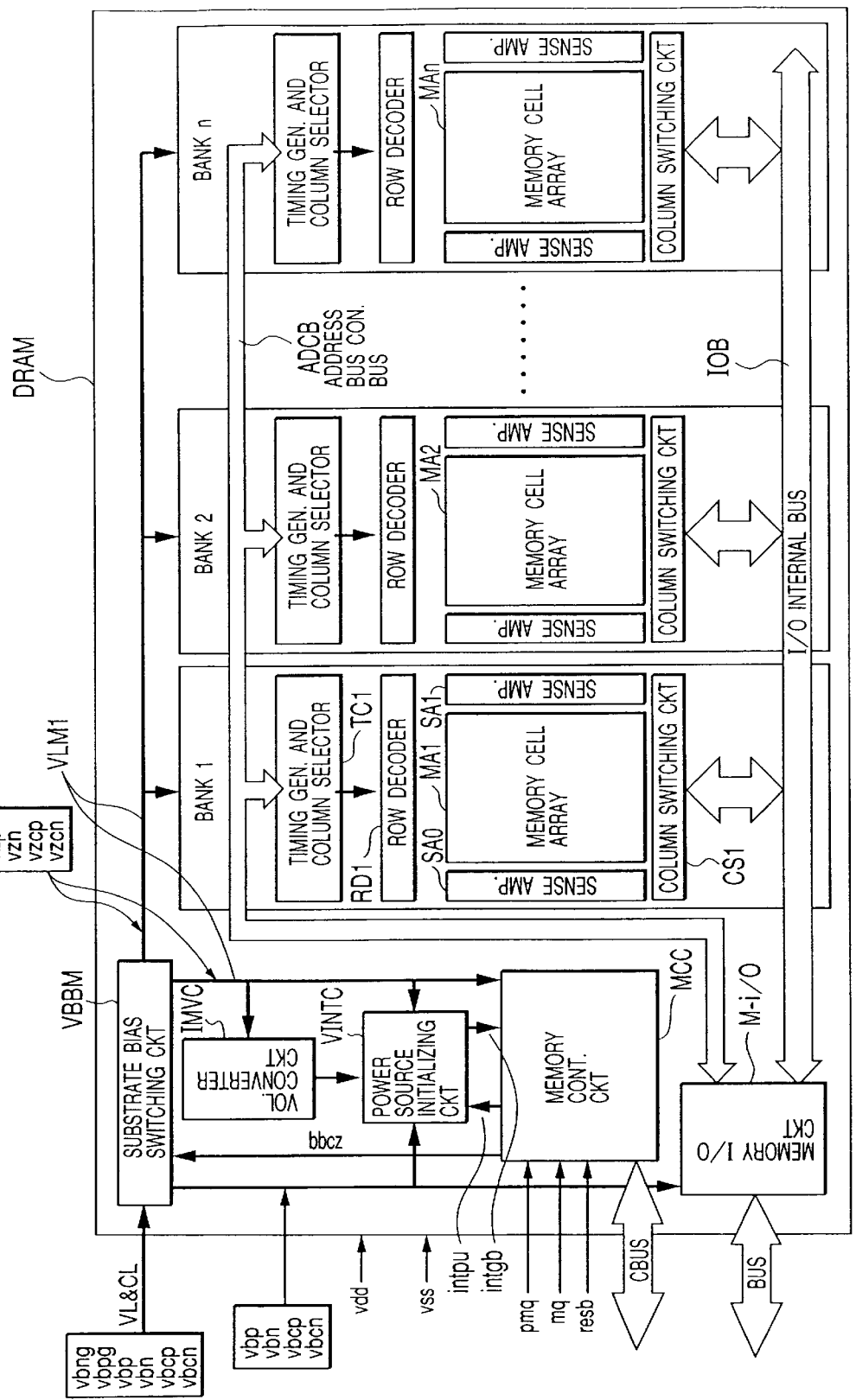
FIG. 8 is a block diagram of a dynamic memory which is a module mounted on the semiconductor integrated circuit device.

FIG. 8 is a block diagram of a dynamic memory DRAM applied to FIG. 1. The dynamic memory DRAM constitutes a module or a functional unit in the system LSI.

Though there is no particular limitation, the dynamic memory DRAM has a bank constitution that is adapted to a large memory capacity. The number of the memory banks is changed in a unit of, for example, a maximum of 16. Each memory bank, for example, a first memory bank bankl, comprises a memory cell array MA1, sense amplifiers SA0 and SA1, a bit line-precharging circuit (not shown) integral with the sense amplifiers, a timing-generating circuit and a column selector TC1, a row decoder RD1 and a column switching circuit CS1.

These plurality of memory banks are provided with an address bus/control bus ADCB for address signals and control signals, and an internal bus (I/O internal bus) IOB for inputting and outputting data. A common memory input/output circuit M-I/O is provided for these buses ADCB and IOB. The memory input/output circuit M-I/O includes a port coupled to the internal bus BUS of FIG. 1.

The dynamic memory DRAM includes a substrate bias switching circuit VBBM coupled to the substrate bias control circuit VBBC of FIG. 1 through the wiring groups VL and CL, an internal power source circuit IMVC, a memory control circuit MMC for receiving the above-mentioned internal operation control signals mq, pmq, reset signal resb and various operation control signals through the control bus CBUS, and a power source initialization circuit VINTC. Detailed constitution of the memory control circuit MMC and detailed constitution of the power source initialization circuit VINTC will be described later with reference to the circuit block diagram of FIG. 25 and the circuit diagram of FIG. 23.

In the above description, a set of elements of a wider range can be considered to be constituted by a decreased number of elements depending on the management unit of design data in the design automation for constituting the semiconductor integrated circuit device. For example, the memory cell array (MA1), sense amplifiers (SA1 and SA2), row decoder (RD1) and column switch (CS1) in one memory bank, can be regarded to constitute a memory mat, and the timing-generating circuit and the column selector (TCl) can be regarded to constitute a bank control circuit. In this case, each memory bank can be more simply regarded to be constituted by the memory mat and the bank control circuit.

In the dynamic memory that is shown, most of the element circuits other than those circuits related to the three modes of the above-mentioned semiconductor integrated circuit device can be almost the same as those in-.the known DRAM constituted as an independent CMOS semiconductor integrated circuit device. Though not described here in detail, the internal constitution thereof is as briefly described below.

(Memory Cell Arrays MA1 to MAn)

The memory cell array such as the memory cell array MA1 includes a plurality of dynamic memory cells arranged in the form of a matrix, a plurality of word lines connected to selection terminals of the corresponding memory cells, and a plurality of bit lines connected to data input/output terminals of the corresponding memory cells.

Figure 15:
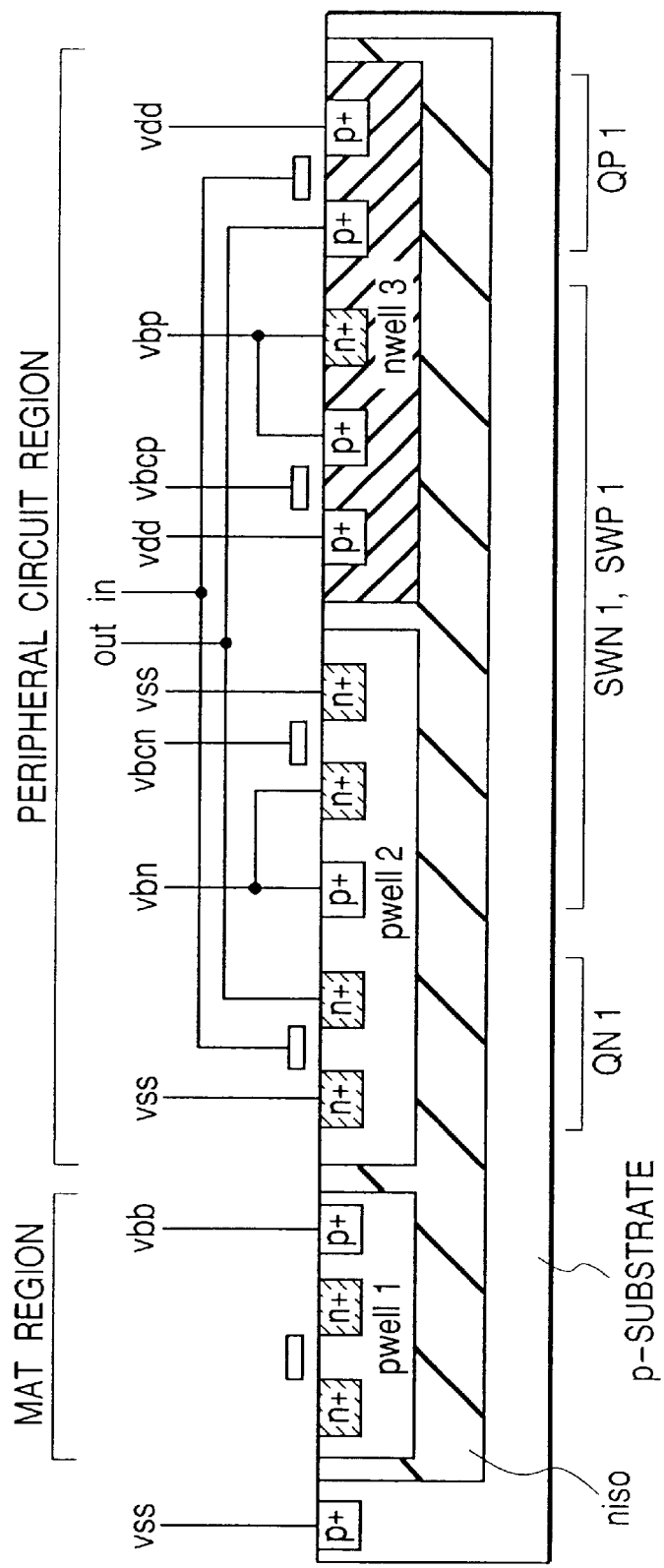
FIG. 15 is a sectional view of a semiconductor substrate in which a MOSFET is formed.

A selected MOSFET that constitutes a memory cell has a structure in which, as shown in FIG. 15, an N-type source region and an N-type drain region are formed in a P-type well region PWELL1 formed in the semiconductor substrate of P-type single crystalline silicon. In FIG. 15, the P-type well regions are electrically isolated from the semiconductor substrate by an N-type isolation semiconductor region niso having.a relatively low impurity concentration. The region niso acquires a positive potential such as the power source voltage vdd of the circuit. The N-type isolation semiconductor region niso works to protect the P-type well region PWELL1 from the undesired carriers that generate in the P-type semiconductor substrate due to (x particles and the like.

The P-type well region PWELL1 forming a memory cell is served with a substrate bias voltage Vbb of a negative polarity formed by the internal power source circuit IMVC in the DRAM. This decreases the tailing current or the leakage current of the selected MOSFET in the memory cell, reducing the leakage of data from the data storage capacity in the memory cell.

The data storage capacity in the memory cell is formed on the P-type well region PWELL1 via an insulating film composed of a silicon oxide film that is not shown. one electrode of the data storage capacity is electrically connected to an electrode region that can be regarded to be the source region of the selected MOSFET. The other electrodes of the plurality of data storage capacities for the plurality of memory cells are in the form of a common electrode which is a so-called plate electrode. The plate electrode as a capacity electrode is supplied with a predetermined potential vpl.

It is desired that the data storage capacity has a relatively small size in order to realize a memory cell array which has a small size and possesses a large capacitance to hold the data for an extended period of time. In the data storage capacity, a dielectric film sandwiched between the electrodes is selected from a material having a relatively large dielectric constant such as tantalum oxide or silicon oxide so as to acquire a large capacitance, and has a very small thickness so as to increase the capacitance per unit area. A plate electrode potential vpl for a plurality of data storage capacities acquires an intermediate potential equal to one-half the power source voltage vdd of the circuit formed by the voltage converter circuit IMVC.

Therefore, the plate electrode potential vpl is set to be nearly one-half the power source voltage vdd either when the high level such as the power source voltage level vdd is supplied or when the low level equal to ground potential of the circuit is supplied to one electrode depending on the data that is to be stored in one electrode of the data storage capacity. That is, the voltage applied to the dielectric film is limited to a small value such as nearly one-half the power source voltage vdd. Therefore, the dielectric film needs have a decreased breakdown voltage. Besides, the undesired leakage of current decreases accompanying a decrease in the applied voltage and, hence, the thickness can be decreased to its minimum degree.

(Timing-Generating Circuit and Column Selector)

The timing generating circuit and column selector like the timing-generating circuit and column selector TC1 are controlled as to their operation by the operation control signals from a global control circuit that is incorporated in the memory control circuit MCC and that will be described later in detail with reference to FIG. 16, and are energized or selected by bank selection signals supplied through the bus ADCB to form various internal timing signals for controlling the operations of various circuits such as bit line-precharging circuits for the bit lines in the memory cell array, row decoders, sense amplifiers and column selectors incorporated therein. The column selector in the timing-generating circuit/column selector is controlled for its operation by an internal timing signal, decodes the column address signal supplied through the bus ADCB, and forms a decoding signal for operating the column switching circuit in the bank such as the column switching circuit CS1.

The row decoder such as the row decoder RD1 is controlled for its operation timing by a timing signal supplied from the timing generating circuit and the column selector, and decodes the address signal supplied through the bus ADCB to select a word line in the corresponding memory cell array.

A bit line-precharging circuit that is not shown is operated by a precharge timing signal at a timing such as before the row decoder is energized, and precharges the bit lines in the corresponding memory cell array to a voltage nearly one-half that of the power source voltage vdd.

(Sense Amplifier)

The sense amplifiers, such as the sense amplifiers SA0 and SA1 are operated by a timing signal for the sense amplifiers generated from the timinggenerating circuit and the column selector circuit like the circuit TC1 after the row decoder is activated, and amplify the signal applied to the bit line by a memory cell selected by the row decoder, i.e., amplify the read signal. A plurality of unit sense amplifiers (not shown) corresponding to the bit lines in the sense amplifier are constituted substantially in the same manner as the sense amplifier of the well-known CMOS constitution.

Each unit sense amplifier possesses a pair of pMoSs of which the gates and drains are connected in a crossing manner, and a pair of nMOSs of which the gates and drains are similarly connected in a crossing manner. The drains of the pair of pMoSs and the drains-of the pair of nMOSs are connected to corresponding pairs of bit lines. The sources of the pair of pMOSs are connected in common and are supplied with an operation potential through a switching MOSFET which is controlled for its operation by a timing signal for the sense amplifiers. Similarly, the sources of the pair of nMOSs are connected in common and are supplied with an operation potential such as the ground potential of the circuit through a switching MOSFET, which is controlled as to its operation by a timing signal for the sense amplifiers.

The two sense amplifiers are arranged to sandwich the memory cell array to establish the following constitution. That is, to the sense amplifier on one side of the memory cell array there are connected every other of the bit lines of a plurality of bit lines of the memory cell array, and to the sense amplifier on the other side of the memory cell there are connected every other one of the remaining bit lines among the plurality of bit lines of the memory cell array. This constitution is effective in decreasing the pitch among the plurality of bit lines in the memory cell array when it is forced to arrange a plurality of MOSFETs to constitute the sense amplifier to maintain a relatively large pitch depending on the required size.

(Column Switching Circuit)

The column switching circuit like the column switching circuit CS1 is operated by a selection signal output from the corresponding column selector. The column switching circuit selects a bit line instructed by a column selector out of a plurality of bit lines in the memory cell array, and connects it to the bus IOB in the memory.

(Memory Input/Output Circuit M-IO)

The memory input/output circuit M-IO is connected to the internal bus BUS in the semiconductor integrated circuit device, receives an address signal and a control signal from the internal bus BUS, and transfers them to the internal bus ADCB. The memory input/output circuit M-IO further inputs and outputs memory data between the bus BUS and the bus IOB in the memory.

(Memory Control Circuit MCC)

Figure 26:
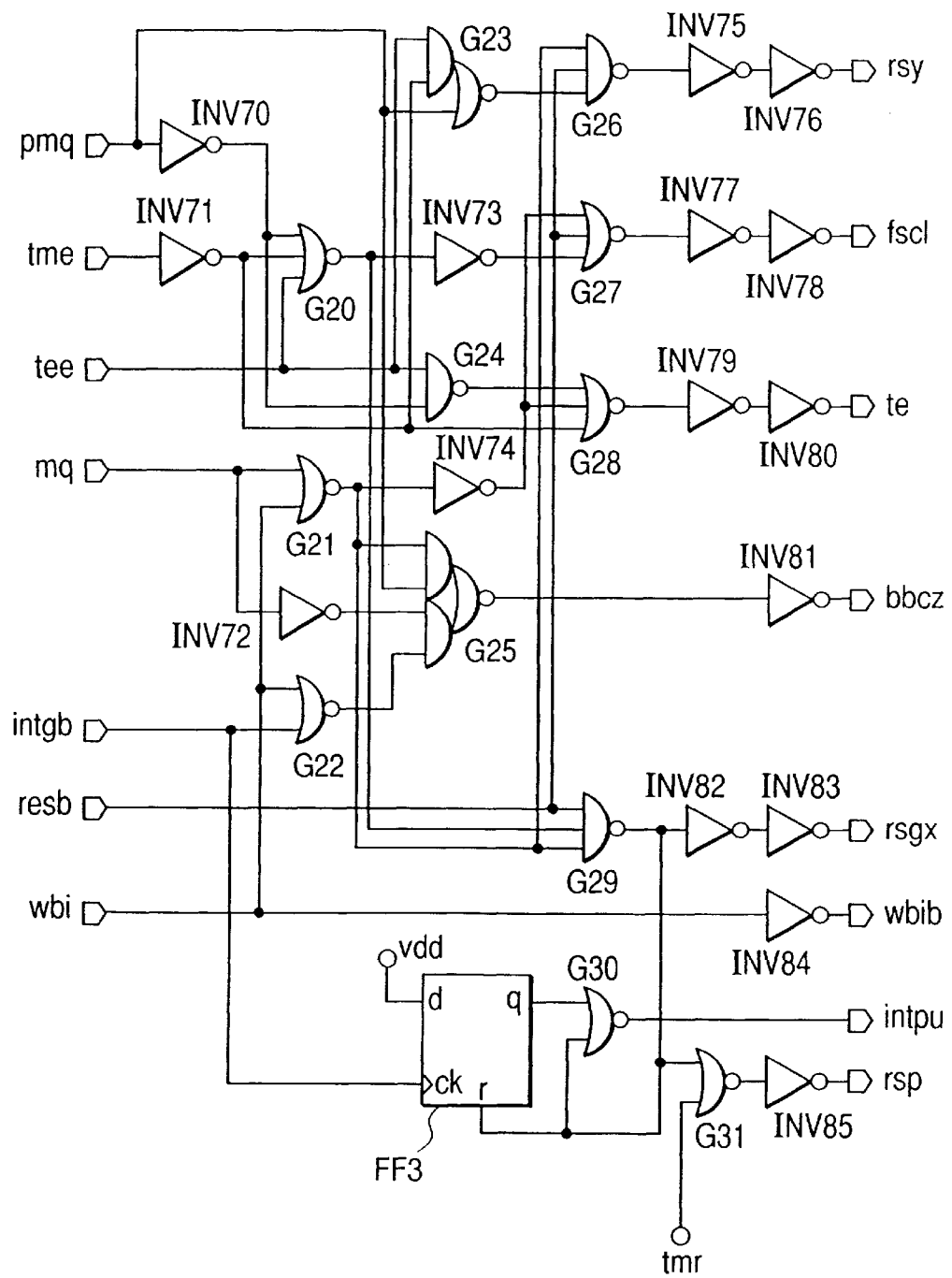
FIG. 26 is a logic circuit diagram illustrating the memory control circuit MCC of FIG. 9 in further detail.
Figure 27:
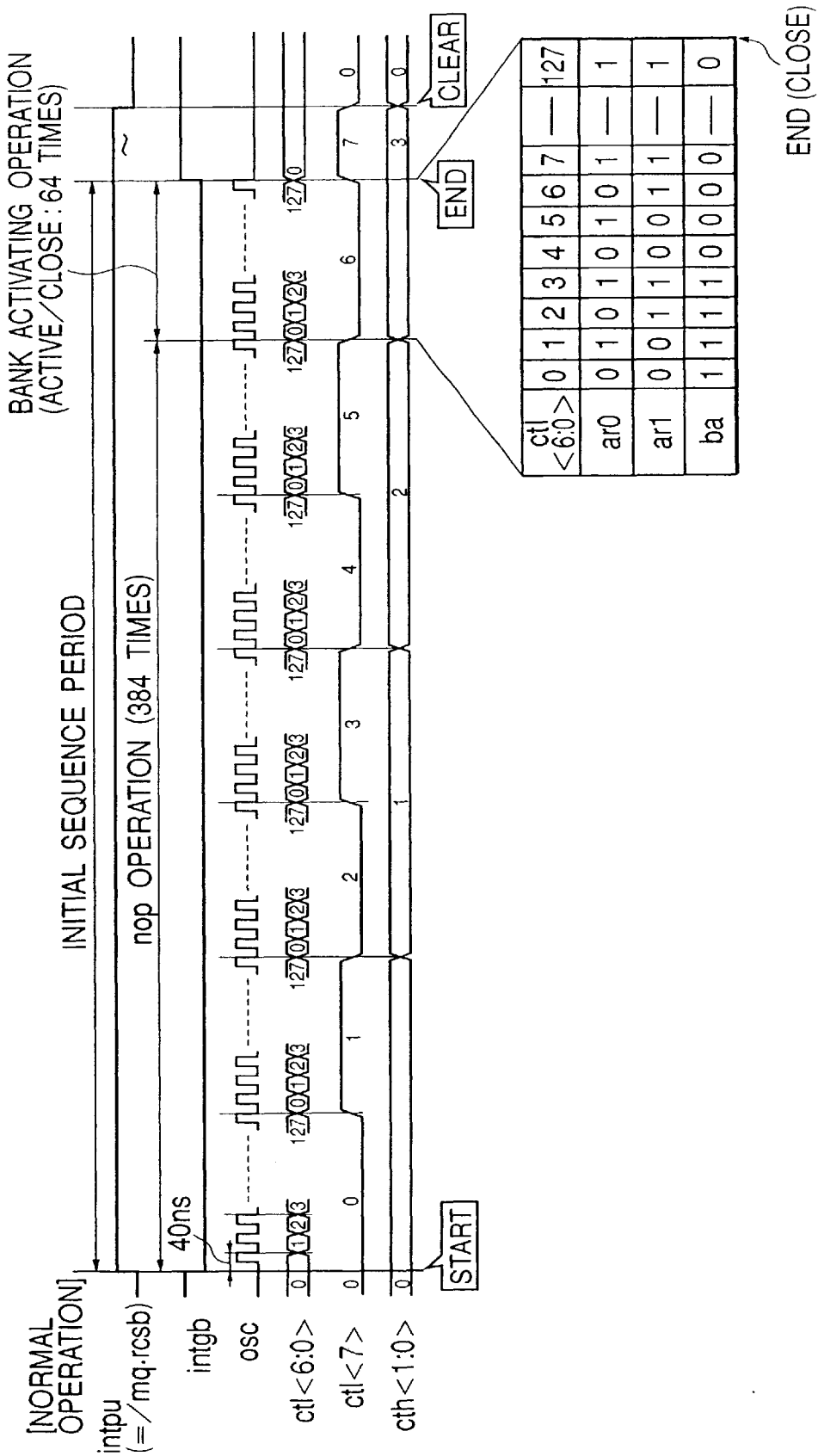
FIG. 27 is a timing chart illustrating some of the timings for explaining the operation of the dynamic memory of FIG. 8.
Figure 28:
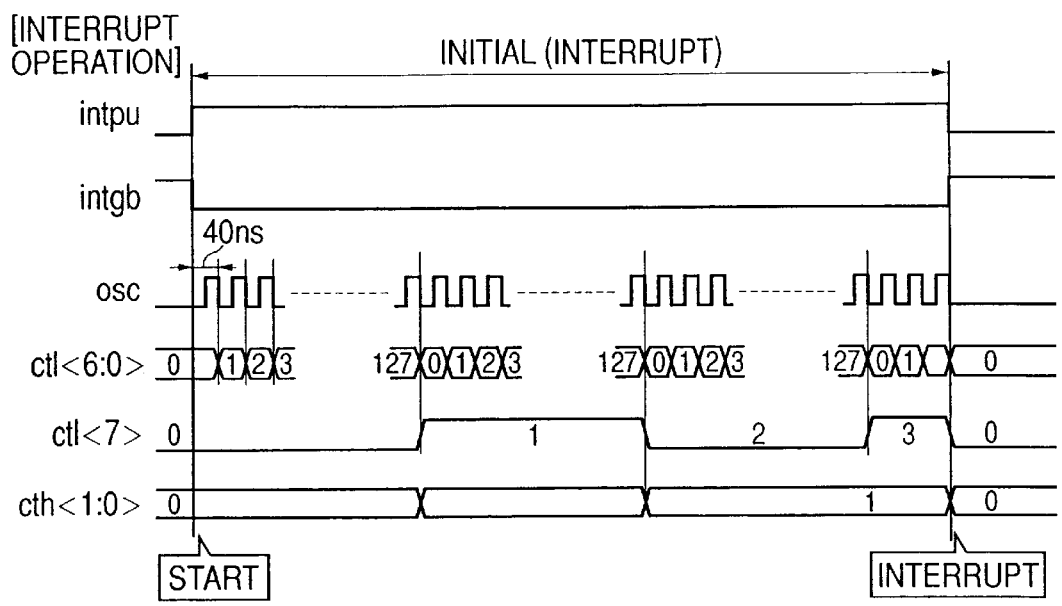
FIG. 28 is a timing diagram illustrating other part of the timings for explaining the operation of the dynamic memory of FIG. 8.

The memory control circuit MCC receives the first and second operation control signals mq, pmq and the reset signal resb in the semiconductor integrated circuit device, and performs a control operation depending upon these signals. The memory control circuit MCC includes a circuit schematically shown in FIG. 9, i.e., a first control logic circuit MSW which receives the first operation control signal mq and the second operation control signal pmq and forms an internal operation control signal bbcz in response thereto, and a second control logic circuit VINT which receives the first operation control signal mq and the reset signal resb and forms a substantially initializing control signal intpu in response thereto. FIG. 26 illustrates the detailed circuit constitution of the memory control circuit MCC.

In this embodiment, the operation of the memory control circuit MCC is related to the operation of the substrate bias switching circuit VBBM, and will, hence, be described later together with the circuit VBBN by utilizing the voltage level correspondence diagram of FIG. 11.

(Substrate Bias Switching Circuit VBBM)

The substrate bias switching circuit VBBM receives various bias voltages vbp, vbn, vbpg, vbng and control signals vbcp, vbcn from the substrate bias control circuit VBBC through the wire groups VL and CL, receives a control signal bbcz from the memory control circuit MCC, and supplies bias voltages to the required circuit portions in the DRAM being controlled by the above bias voltages and the control signal. The constitution and operation of some circuits in the substrate bias switching circuit VBBM will be described later with reference to the circuit diagrams of FIGS. 20 and 21 and the operation diagram of FIG. 22.

(Voltage Conversion Circuit IMVC)

The voltage conversion circuit IMVC receives the power source voltage supplied across the power source terminal VDD of DRAM and the reference potential terminal VSS, and forms internal voltages such as substrate bias voltage Vbb and plate voltage vpl for the above-described memory cell arrays. Though there is no particular limitation, the substrate bias voltage Vbb for the memory cell array is formed in the circuit IMVC in the DRAM which is a module independent from the substrate bias control circuit VBBC of FIG. 1. The circuit for forming the bias voltage vbb of the negative potential level is similar to the one in the well-known DRAM.

Though not diagramed in detail, this circuit is constituted by an oscillator such as ring oscillator that includes a CMOS control gate and plural stages of CMOS inverter circuits and is operated by the power source voltage VDD, a charge pumping circuit which receives an oscillation signal of an amplitude equal to the power source voltage level from the oscillator through a capacitor and a diode-connected MOSFET and periodically produces a pulse of a negative potential level, and a rectifier circuit such as diode-connected MOSFET that supplies to the output point a pulse of the negative potential level produced by the charge pumping circuit. From the output point there is obtained an output Vbb for a capacitor such as parasitic capacitor therein.

The data signal read out from the dynamic memory cell has a very small level, and the constitution that independently forms the bias voltage vbb is advantageous from the standpoint of suppressing the potential change in the p-type well region pwelll (see FIG. 15) so that the very small level will not be disturbed. The circuit for forming the bias voltage Vbb permits the current to undesirably leak in a relatively small amount into the p-type well region pwelll from the memory cell array, and produces a relatively small output corresponding thereto and, hence, gonsumes the electric power in very small amounts.

(Power Source Initializing Circuit VINTC)

The power source initializing circuit VINTC initializes the DRAM circuit being controlled by the memory control circuit MCC. Details of the constitution of the power source initializing circuit VINTC and the initializing operation will become obvious from the description appearing later with reference to the diagrams of an initialization timing-generating circuit of FIGS. 23 and 24, timing charts of FIGS. 27 and 28, and curves representing changes in the voltages of FIG. 29.

Figure 25:
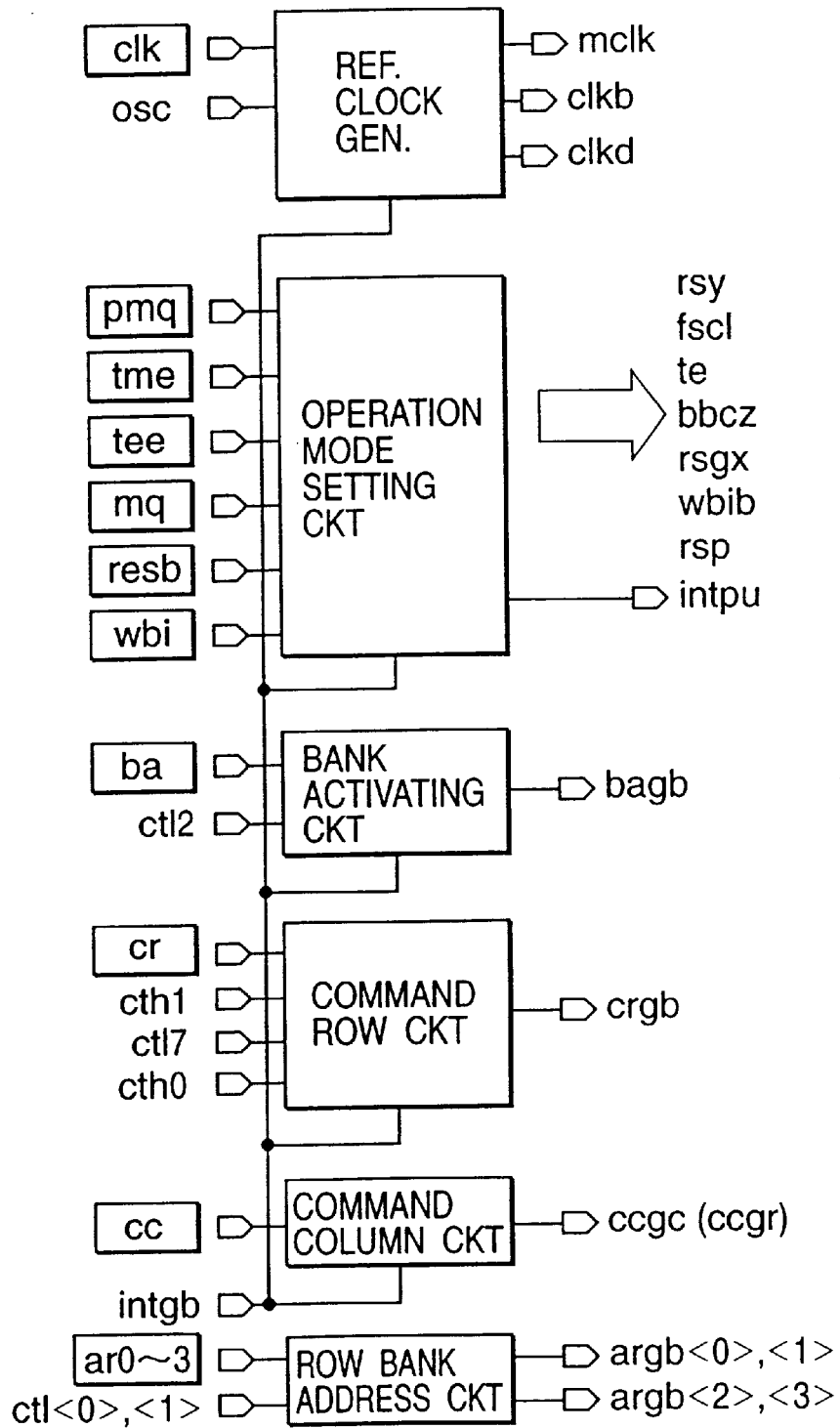
FIG. 25 is a block diagram illustrating a dynamic memory control circuit of FIG. 8.

Next, the control circuit of FIG. 25 in the memory control circuit MCC will be described. In FIG. 25, the reference clock-generating circuit receives a clock signal clk supplied to the semiconductor integrated circuit device, an oscillation signal or an internal initializing clock signal osc output from the power source initializing circuit VINTC shown in FIG. 23 that will be described later in detail, and an initializing operation instruction signal intgb, and forms various internal clock signals mclk, clkb and clkd necessary for the internal operations in the dynamic memory.

The operation mode setting circuit forms first and second operation control signals mq, pmq, reset signal resb, as well as various signals rsy, fscl, te, bbcz, rsgx, wbib, rsp and intpu for setting the operation modes based on a test module enable signal tme, a test mode enable signal tee and a burn-in enable signal wbi that are supplied, through a probe card, to the terminals such as pad electrodes formed on a semiconductor substrate only for exclusively testing a dynamic memory at the time when the semiconductor device is being produced. The abovementioned various signals are concerned with the testing and burn-in, which have no direct relationship to the present invention, and are not described here.

The bank-activating circuit receives a signal ba supplied through the control bus CBUS and a count signal ct12 which is a pulse signal output from the power source initializing circuit, and forms a bank activating signal bagb.

The command row (row) circuit receives a signal cr supplied through the control bus CBUS as a command signal, receives count signals cth0, cth1, ct17 which are pulse signals output from the power source initializing circuit as command signals at the time of initializing the power source, and forms an output signal crgb.

The command column (column) circuit receives a signal cc supplied through the control bus CBUS as a command signal and forms an output signal ccgc. The row bank address circuit receives signals ar0 to ar3 supplied through the control bus CBUS as row bank address signals, receives count signals cth0, ct10, ct11 which are pulse signals output from the power source initializing circuit, and forms a bank address signal.

Most of the circuits shown in FIG. 25 are controlled as to their operations depending on the non-significant level of the signal intgb such as the initialization non-instruction level. That is, when the initializing operation instruction signal intgb is at a non-significant level such as the initialization non-instruction level, the circuit responds to a signal from an external unit as shown. Conversely, when the signal intgb is at a significant level such as the initialization instruction level, the circuit does not respond to the signal from the external unit, but responds to the internal signal output from the power source initializing circuit VINTC. The don't care feature against the external signal by the initialization operation instruction signal-intgb, is meaningful in avoiding undesired erroneous operation in the power source initializing operation that will be described later.

The dynamic memory DRAM which is a module or a functional unit of FIG. 8 is controlled for its substrate bias voltage in the internal circuit depending on the operation mode, standby mode and operation standby mode, as described above, instructed to the whole semiconductor integrated circuit.

(Several Constitutions for the Modes)

The DRAM takes different constitutions for the operation standby. That is, according to one constitution, most of the circuits are placed in the energized state in the operation standby (hereinafter referred to as constitution 1 or X/Y combination type).

According to another constitution, the circuits to be energized are substantially limited to only those circuits that are related to the operation for refreshing the memory. According to this constitution, the memory control circuit MCC, timing-generating circuit and column selector, row decoder and row address system of the sense amplifier are placed in operation or are energized, and the column selector and the system that does not affect the refreshing operation such as the data input/output circuit in the memory input/output circuit M-IO are placed out of operation or are de-energized (hereinafter referred to as constitution 2 or X/Y separation type).

The constitution 2 is used for the following reasons. That is, in the operation standby, the DRAM executes the refreshing operation in which the memory cells are periodically selected, the read data given from the selected memory cells to the bit lines are amplified or recovered as to their levels by the sense amplifier, and the data having recovered levels are written again into the selected memory cells. In the refreshing operation, the data need not be sent out of the DRAM. Therefore, the constitution 2 is used. In the constitution 2, the whole DR.AM and the control operation thereof become complex. The constitution 2 however, is effective in further decreasing the consumption of electric power in the operation standby.

Figure 20:
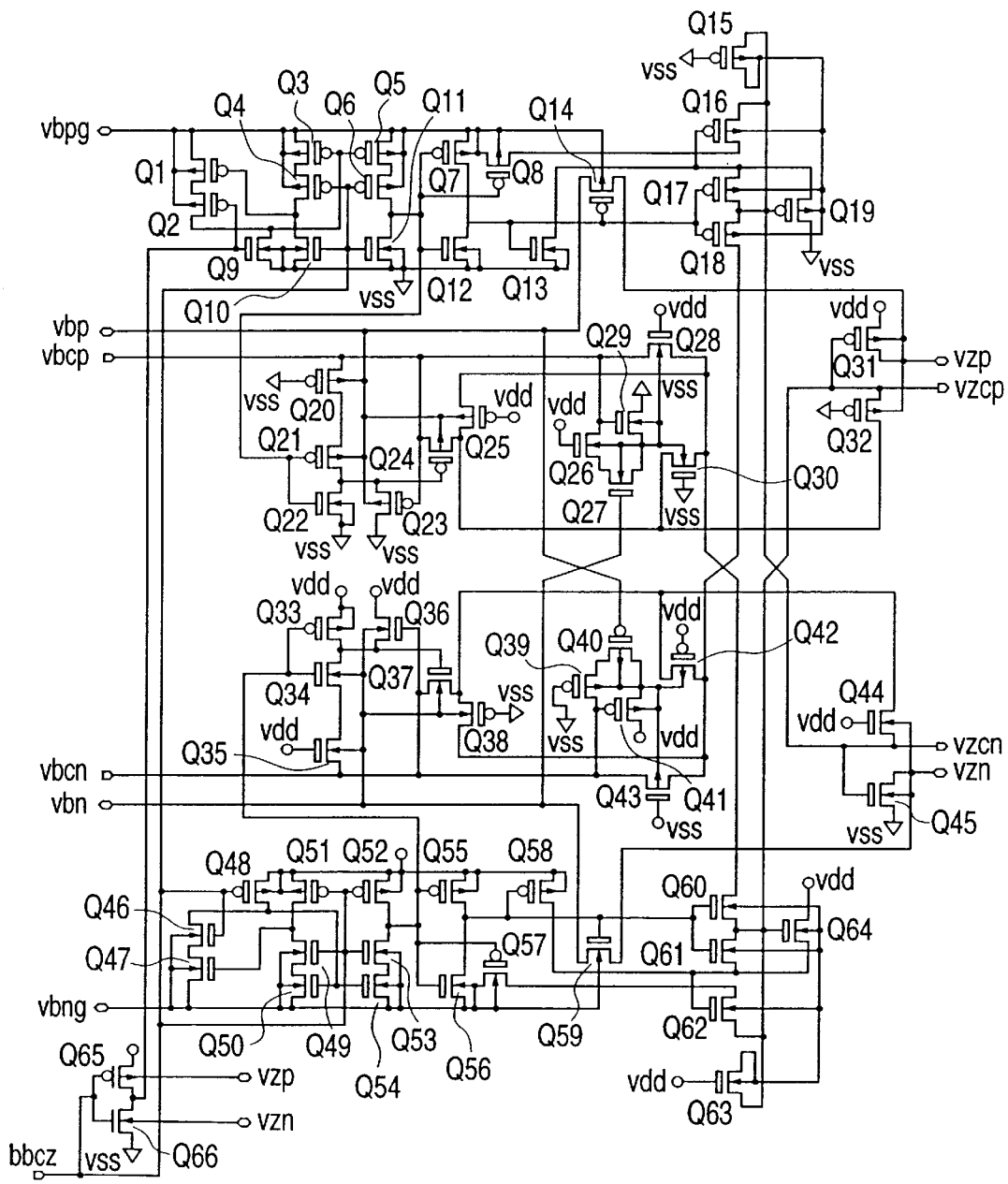
FIG. 20 is a diagram illustrating a major dircuit in the circuit block MCC of FIG. 8.

The substrate bias switching circuit VBBM includes a CMOS circuit having a level conversion function as exemplified in FIG. 20. In response to a control signal bbcz of the power source voltage VDD level output from the memory control circuit MCC and various bias voltages vbpg, vbp, vbn, vbcp and vbcn supplied from the substrate bias control circuit VBBC of FIG. 1, the CMOS circuit forms control signals vzp, vzn, vzcp, vzcn of a level adapted to switching the substrate bias voltage. Concrete levels of the above voltages and signals will be obvious from FIG. 11.

FIGS. 12, 13, 14 and 15 illustrate constitutions for switching the substrate bias voltage in response to control signals vzp, vzn, vzcp and vzcn supplied from the substrate bias switching circuit VBBM.

Figure 14:
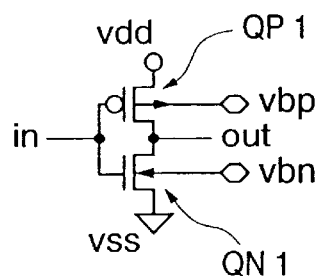
FIG. 14 is a diagram illustrating a CMOS inverter circuit.

FIG. 14 illustrates a CMOS circuit of which the substrate bias voltage is controlled depending on its energized state and non-energized state. The circuit of FIG. 14 constitutes a CMOS inverter circuit that is operated by the power source voltage vdd and by the reference potential vss such as the ground potential of the circuit. The substrate gate of the N-channel MOSFET QN1 of FIG. 14 is supplied with the substrate bias voltage vbn from the substrate bias control circuit VBBC of FIG. 1, and the substrate gate of the P-channel.MOSFET QP1 is supplied with the substrate bias voltage vbp from the circuit VBBC.

Figure 12:
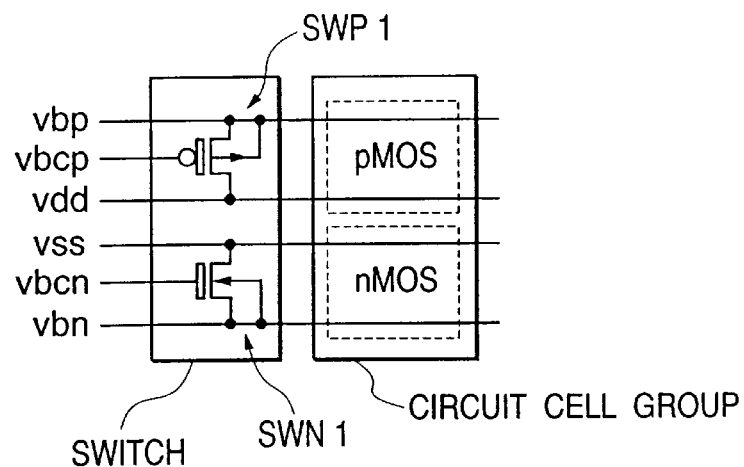
FIG. 12 is a diagram illustrating a substrate bias voltage switching circuit.
Figure 13:
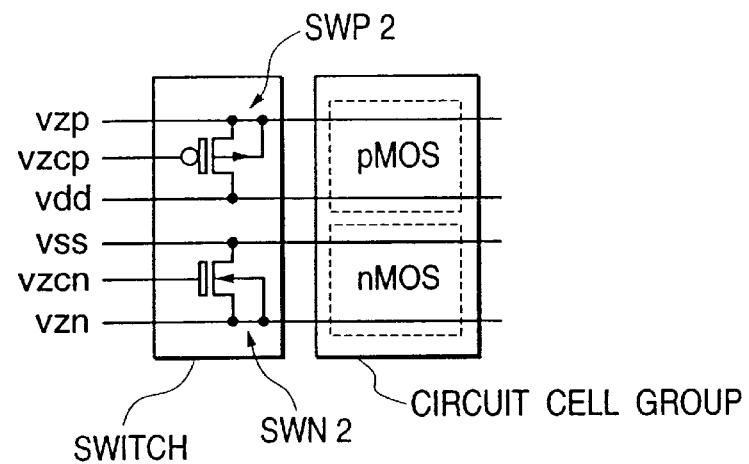
FIG. 13 is a diagram illustrating another substrate bias voltage switching circuit.

FIG. 12 illustrates a substrate bias voltage switching circuit in the circuit of FIG. 14. In FIG. 15, the P-channel MOSFET SWP1 is connected at its source and substrate gate to the substrate bias voltage line vbp, and is connected at its drain to the power source line vdd of the circuit. The gate of the MOSFET SWP1 is served with the output control signal vbcp from the substrate bias switching circuit shown in FIG. 20.

In this constitution, when the control signal vbcp has the low level or the activated level nearly equal to the ground potential Vss of the circuit, the P-channel MOSFET SWP1 is turned on. Due to the short-circuit established by the MOSFET SWP1 that is turned on, the potential of the bias voltage line vbp, i.e., the substrate bias voltage for the P-channel MOSFET QP1 assumes a level nearly equal to the power source voltage Vdd of the circuit. At this moment, the P-channel MOSFET shown in FIG. 14 assumes the shallow substrate bias state.

When the control signal vbcp assumes the high level or the inactivated level nearly equal to the potential of the bias voltage line vbp, the P-channel MOSFET SWP1 is turned off, and does not substantially affect the potential of the bias voltage line vbp. In this case, the potential of the bias voltage line vbp assumes a level determined by the substrate bias control circuit VBBC of FIG. 1, and the P-channel MOSFET QP1 of FIG. 14 assumes the substrate bias state that corresponds to the bias potential.

Similarly, when the control signal vbcn has a level or activated level nearly equal to the power source potential Vbp of the circuit, the N-channel MOSFET SWN1 of FIG. 12 is turned on, so that the potential of the bias voltage line vbn, i.e., so that the substrate bias voltage for the N-channel MOSFET QN1 assumes a level nearly equal to the ground potential Vss of the circuit. In this case, the Nchannel MOSFET QN1 shown in FIG. 14 assumes the shallow substrate bias state.

When the control signal vbcn has a negative potential level or an inactivated level nearly equal to the potential of the bias line vbn, the N-channel MOSFET SWN1 of FIG. 12 is turned off, and no longer affects the potential of the bias voltage line vbn. In this case, the potential of the bias voltage line vbn assumes a level determined by the substrate bias control circuit VBBC of FIG. 1, and the N-channel MOSFET QN1 of FIG. 14 assumes the substrate bias state that corresponds to the bias potential.

The switching MOSFETs SWP1 and SWN1 shown in FIG. 12 may be constituted in another semiconductor region independent from the semiconductor region in which are formed MOSFETs for constituting the circuit of FIG. 14. Like the structure shown in FIG. 15, however, these switching MOSFETs may be constituted in common in the region substantially in the same way as the semiconductor region for forming MOSFETs for constituting the circuit, i.e., in the N-type well region nwell3 and in the P-type well region pwell2. Such a common semiconductor region does not require the area needed by the semiconductor substrate for independence, and is advantageous from the standpoint of decreasing the module size.

FIG. 10 illustrates relationships between the voltage levels of bias voltages vbp, vbn, vbpg, vbng and control signals vbcp, vbcn supplied from the substrate bias control circuit VBBC of FIG. 1 to the dynamic memory DRAM of FIG. 8 and the voltage levels of cont@ql signals bbcz, vzcp, vzcn and bias voltages vzp, vzn formed in the dynamic memory of FIG. 8.

Though there is no particular limitation, it should be comprehended that the bias voltages vzp and vzn stand for bias voltages applied to the circuits (hereinafter also referred to as X-system circuits) that are energized during the operation standby in the above-mentioned constitution 2 or in the X/Y separation type.

It should be noted that the bias voltages vbp and vbn are those applied to the circuits (hereinafter also referred to as Y-system circuits) that are de-energized during the operation standby in the abovementioned constitution 2 or in the X/Y separation type, and applied to the whole circuitry in the constitution 1 or in the X/Y combination type.

Figure 16:
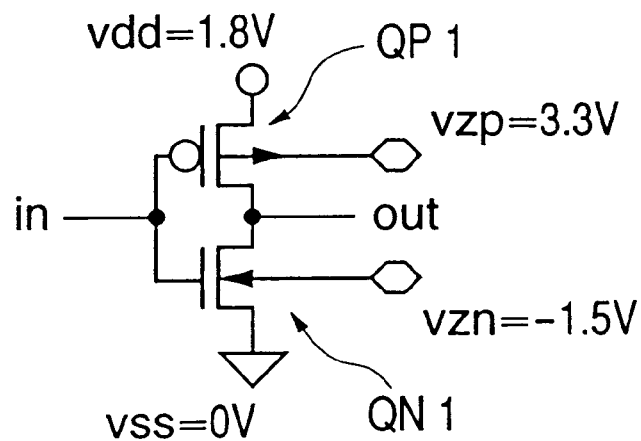
FIG. 16 is a diagram illustrating another CMOS inverter circuit.
Figure 18:
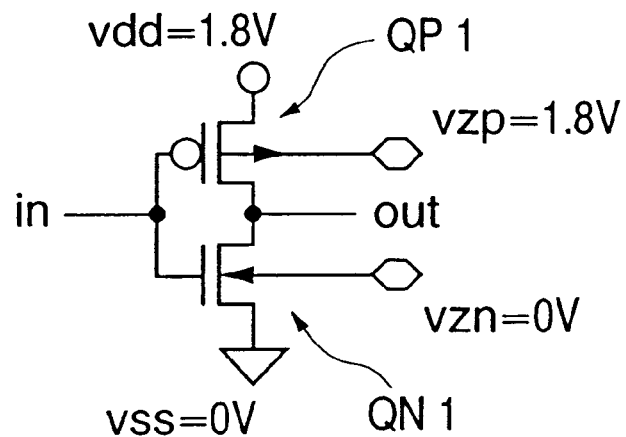
FIG. 18 is a diagram illustrating a further CMOS inverter circuit.
Figure 17:
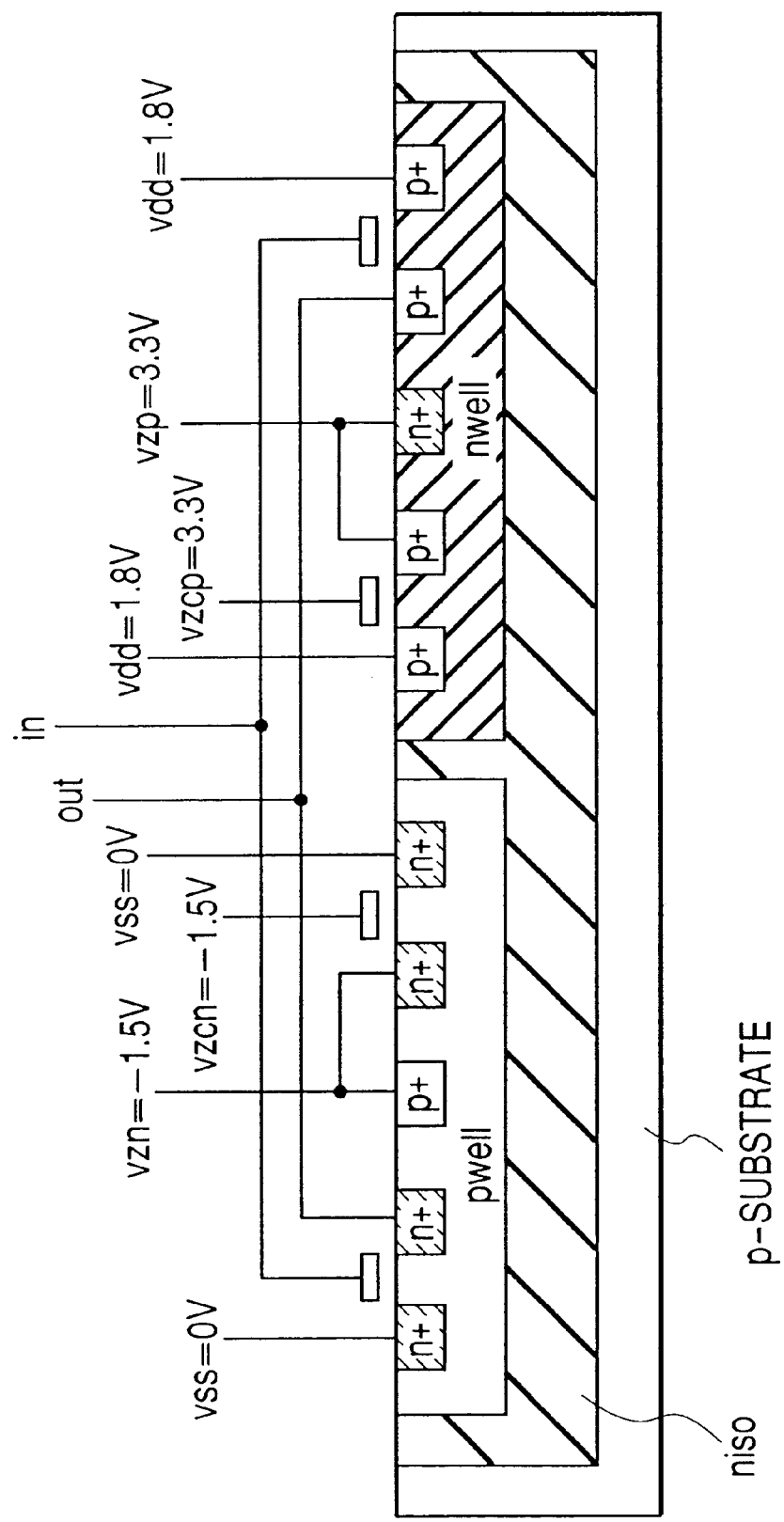
FIG. 17 is another sectional view of the semiconductor substrate in which the MOSFET is formed.
Figure 19:
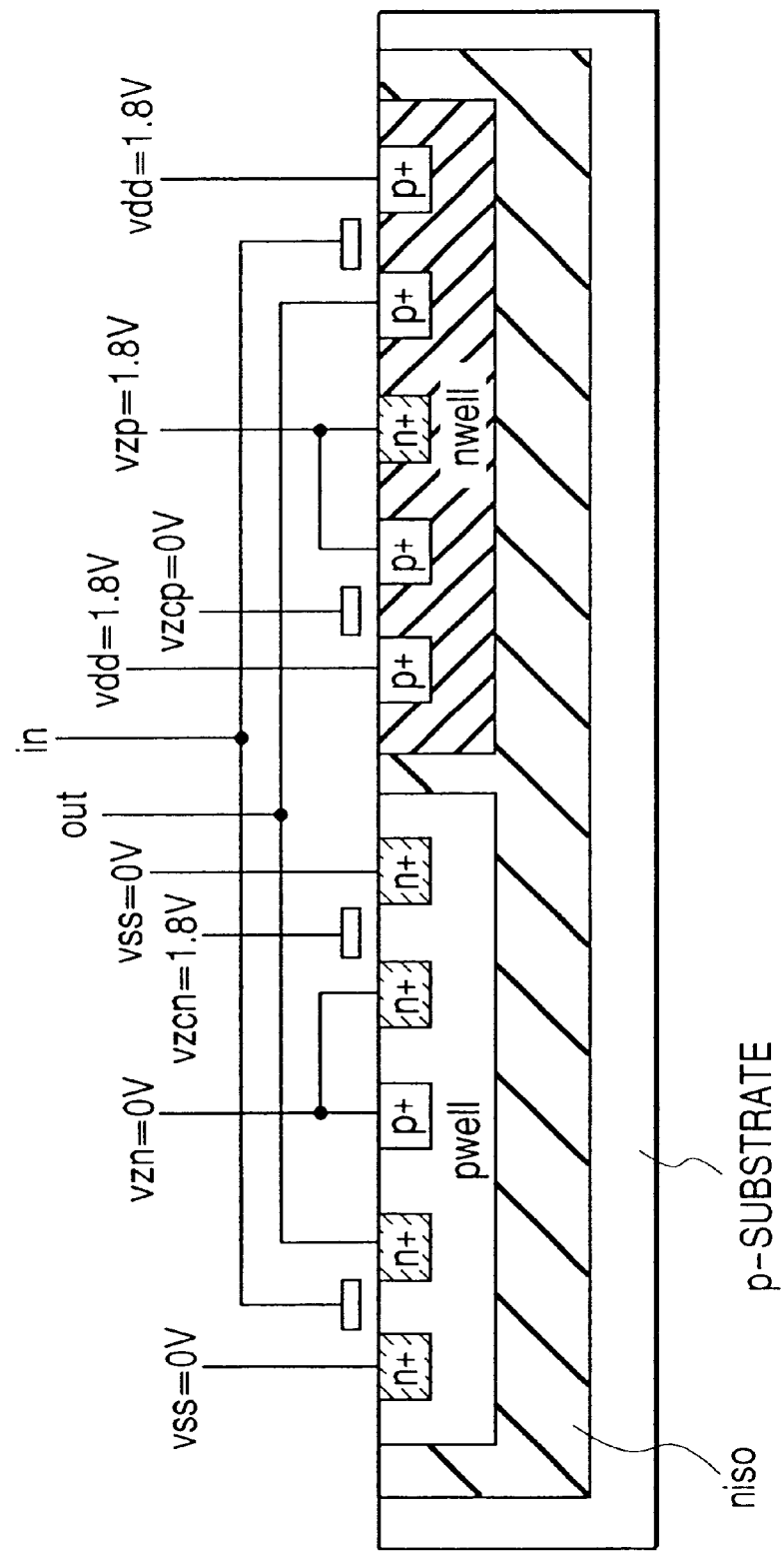
FIG. 19 is a further sectional view of the semiconductor in which the MOSFET is formed.

FIG. 16 is a diagram illustrating a CMOS inverter circuit in a state where the substrate bias voltages vzp and vzn are rendered to be deep biases, and FIG. 18 is a diagram illustrating the CMOS inverter circuit in a state when the substrate bias voltages vzp and vzn are rendered to be shallow biases. FIG. 17 is a sectional view of a semiconductor substrate constituting the circuit of FIG. 16 and the switching MOSFET for switching the substrate bias, and, similarly, FIG. 19 is a sectional view of a semiconductor substrate constituting the circuit of FIG. 18 and the switching MOSFET for switching the substrate bias.

Figure 11:
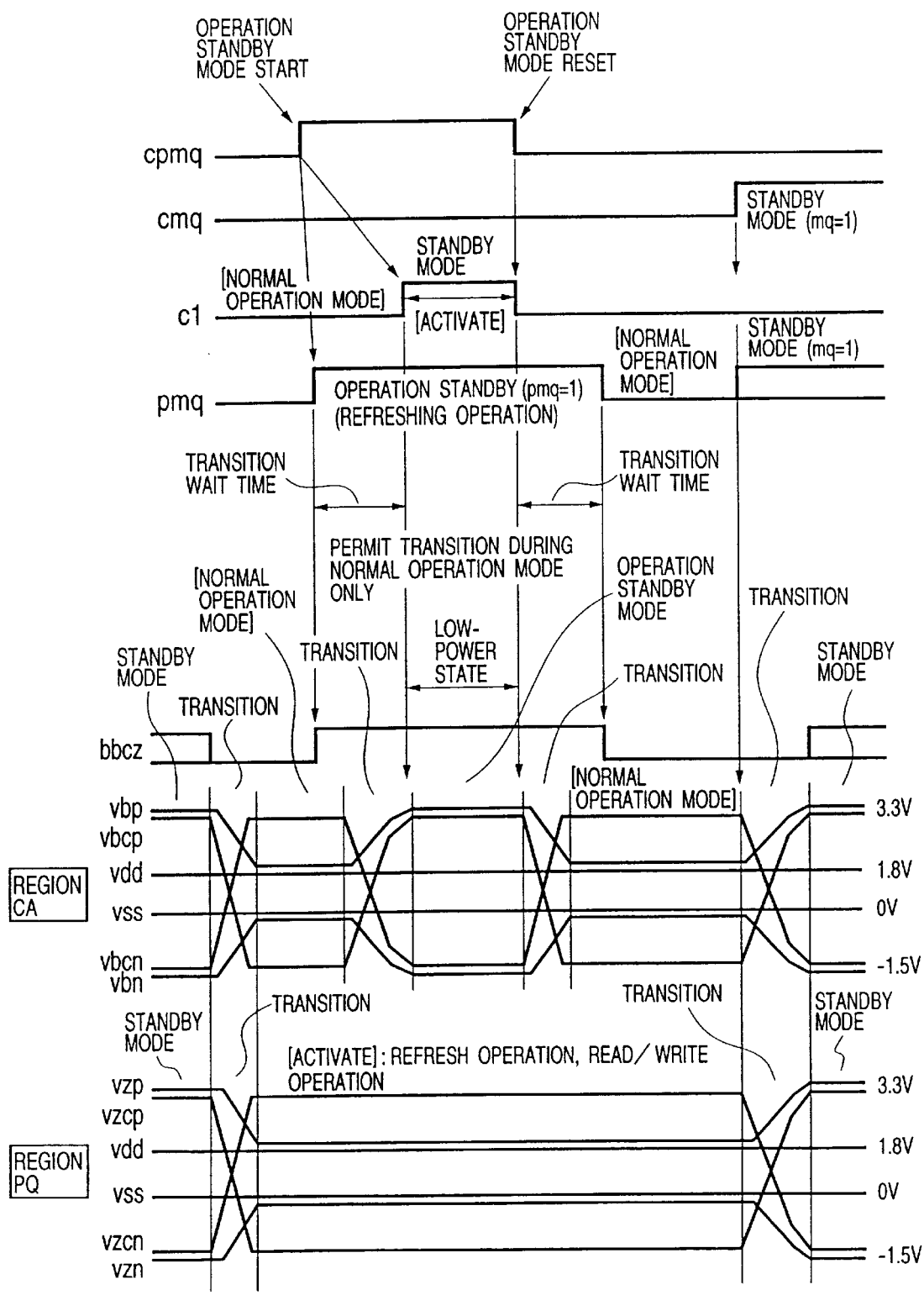
FIG. 11 is a timing chart illustrating the operation timings of the dynamic memory of FIG. 8.

In FIG. 11, when the external operation control signals cmq, cpmq supplied to the external terminals T3 and T4 of FIG. 1 are instructing the second mode, i.e., the standby mode or complete standby mode, then, the signals and bias voltages vbcp, vbp and vbpg from the substrate bias control circuit VBBC of FIG. 1 assume +3.3 volts corresponding thereto, the bias voltages vbcn, vbn and vbng assume −1.5 volts, the control signal bbcz output from the control logic circuit MSW of FIG. 9 will assume the low level such as level 0, and the switch control signals vzcp and vzcn will assume +3.3 volts and −1.5 volts, respectively, due to the circuit shown in FIG. 20 that receives the signal bbcz.

In response thereto, the substrate bias voltages vzp and vbp applied to the internal circuits of the dynamic memory assume a level such as +3.3 volts, i.e., a level that causes the P-channel MOSFET to assume the deep substrate bias state. At the same time, the substrate bias voltages vzn and vbn also assume the level such as −1.5 volts that causes the N-channel MOSFET to assume the deep substrate bias state.

Similarly, in the first mode or normal operation mode in FIG. 10, the substrate bias voltages vzp and vbp assume a level substantially equal to the power source voltage Vdd of the circuit such as +1.8 volts, i.e., a level that causes the P-channel MOSFET to assume the shallow substrate bias state, and the substrate bias voltages vzn and vbn assume a level substantially equal to the reference potential vss of the circuit such as 0 volt, i.e., a level that causes the N-channel MOSFET to assume the shallow substrate bias state.

In the operation standby mode, the bias voltages vzp and vzn, i.e., the bias voltages applied to the circuits that are placed in the energized state for the refreshing operation, assume shallow bias levels such as +1.8 volts and 0 volt, respectively. Similarly, the substrate bias voltages vbp and vbn assume bias levels adapted to the constitution 2 or the X/Y separation type and to the constitution 1 or the X/Y combination type.

FIG. 11 illustrates desired timings for changing the internal control signals from the standpoint of holding the data in shifting the mode based on the external operation control signals cmq and cpmq. The circuit for adjusting the timing required for controlling the shift can be realized by a well-known circuit such as a timing circuit comprising a delay circuit and a gate circuit, or a timer for counting the clock signals, and is not described here in detail.

Briefly speaking, FIG. 11 illustrates that when the external operation control signal has changed into a level that indicates a shift from the normal operation mode into the operation standby, the substantial operation standby mode is assumed in the dynamic memory after the transition wait time required for shifting into the substrate bias voltage for the deep bias level. Similarly, when the external operation control signal has changed into a level that indicates a shift from the operation standby mode into the normal operation mode, the normal operation mode is assumed after the transition wait time required for shifting into the substrate bias voltage of the shallow bias state.

According to this embodiment as will be obvious from the table of FIG. 7, the signal mq that corresponds to the first operation control signal cmq from the external unit is regarded to be substantially the most preferential control signal. Therefore, no management is required for the transition wait time.

Figures 21, 22:
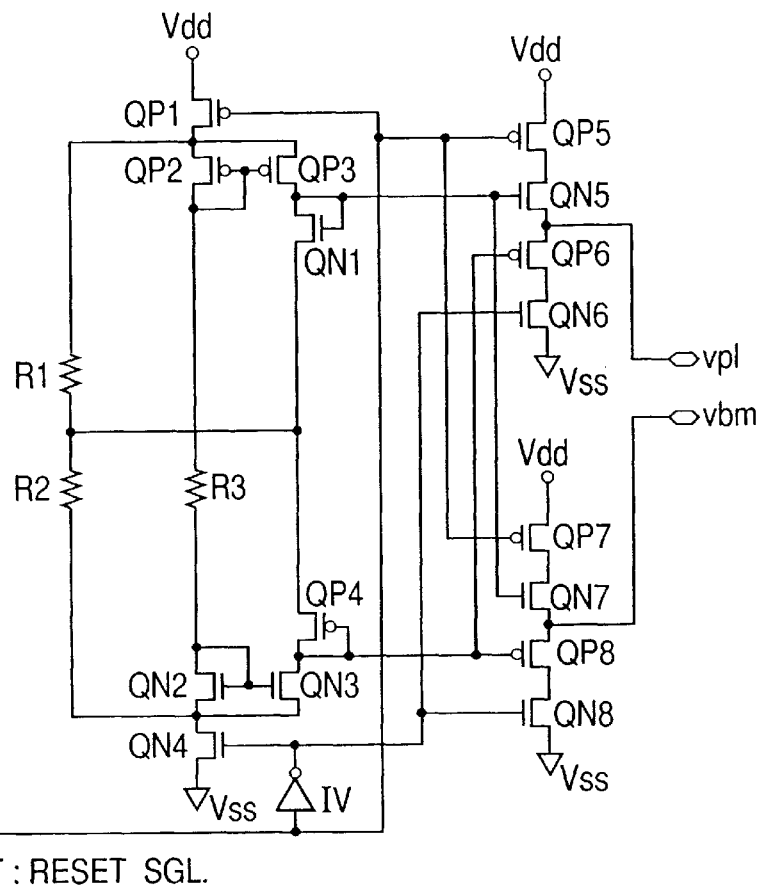
FIG. 21 is a diagram illustrating a major circuit in a circuit block IMVC of FIG. 8.
FIG. 22 is a diagram of voltages illustrating a relationship between the operation modes and the voltage levels of the circuit of FIG. 21.

FIG. 21 is a diagram of a voltage-generating circuit for producing a plate voltage vpl supplied to the plate electrodes in the memory cell array and a bit line voltage vbm for determining a precharge potential of the bit line. As described earlier, the circuit of FIG. 21 constitutes the voltage conversion circuit IMVC in the dynamic memory DRAM of FIG. 8.

In FIG. 21, the MOSFETs QP1 to QP4 and QN1 to QN4 as well as resistors R1 to R3, as a whole constitute a voltage-dividing circuit which is operated by the logic level 0 or the non-reset level of the reset signal RST to divide the power source voltage Vdd, and forms a voltage corresponding to the threshold value of the MOSFET. The MOSFETs QP5, QP6, QN5 and QN6 constitute a first output circuit, and the MOSFETs QP7, QP8, QN7 and QN8 constitute a second output circuit.

When the reset signal RST has been set to a nonreset level due to the resistors R1 and R2 suitably set in the voltage-dividing circuit, the first output circuit produces a plate voltage vpl nearly equal to one-half the power source voltage Vdd. Likewise, the second output circuit produces a bit line voltage vbm nearly equal to one-half the power source voltage Vdd.

When the reset signal RST has been set to the reset level like logic level 1, then, the MOSFETs QP1, QN4 in the voltage-dividing circuit and MOSFETs QP5, QN6, QP7 and QN8 of the first and second output circuits, are turned off in response thereto. Thus, the voltage-dividing circuit, and the first and second output circuits are all placed in the inoperative state, i.e., in a state where they do not substantially consume electric power.

FIG. 22 is a diagram illustrating the states of the circuit of FIG. 21. The reset signal RST is substantially the one that instructs the first mode, i.e., the normal operation mode and the second mode, i.e., the standby mode. In the normal operation mode, the voltages vbm and vpl assume levels as described above. In the standby mode, the outputs vpl and vbm of the first and second output circuits assume a high-impedance state due to the MOSFETs that are in the off state.

Figure 23:
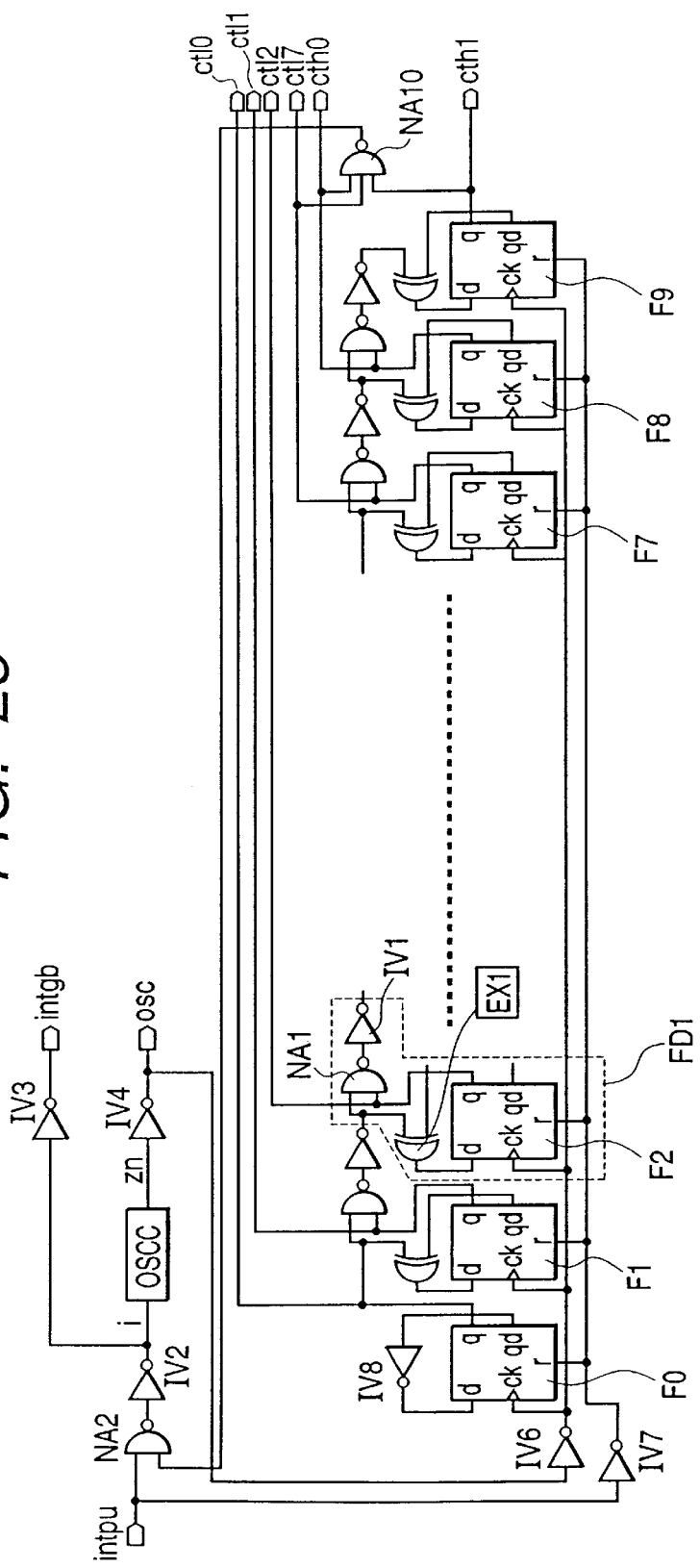
FIG. 23 is a diagram illustrating a major circuit of a circuit block VINTC of FIG. 8.

The power source initializing circuit VINTC of FIG. 8 is constituted as shown in FIG. 23. If briefly described, the power source initializing circuit VINTC should be regarded to be an initialization clock-generating circuit which is substantially a puslse-generating timer circuit constituted by a self-excited oscillation circuit and a counter circuit.

Figure 24:
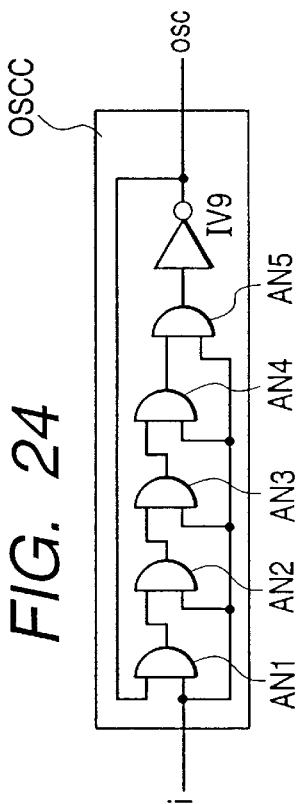
FIG. 24 is a circuit diagram illustrating the circuit OSCC of FIG. 23 in further detail.

In FIG. 23, the self-excited oscillation circuit OSCC comprises a controlled self-excited oscillation circuit having an operation control terminal i. For example, as shown in FIG. 24, the oscillation circuit OSCC is constituted by a plurality of AND circuits AN1 to AN5 and an inverter that are so connected as to constitute a so-called ring oscillation circuit, and the oscillation circuit undergoes self-excited oscillation operation due to the high level of the operation control terminal i, and ceases to operate in response to the low level at the operation control terminal i. In the halted state, the oscillation circuit OSCC does not substantially consume electric power.

The counter is constituted by a plurality of unit counter stages. The constitution of the counter has no direct relationship to the present invention and is not described here in detail, but is as schematically described below. That is, the unit counter of the first stage is constituted by a unit counter F0 which may be a delay-type flip-flop for receiving the signal at the input terminal d in response to a pulse supplied to the clock terminal, and an inverter circuit IV8. The unit counter of the next stage is constituted by a unit counter F1 and a plurality of gate circuits that are shown for inputting an input to the input terminal d. The plurality of stages of unit counters are connected in cascade as shown.

The power source initializing circuit VINTC of FIG. 23 is controlled for its operation by a control signal intpu output from the memory control circuit MCC of FIGS. 8 and 9. That is, when the control input intpu assumes the high level, the controlled-type self-excited oscillation circuit OSCC in the power source initializing circuit VINTC oscillates and its oscillation output is supplied to the counter through the inverter circuits IV4 and IV6. Therefore, the counter performs the counting operation to output count signals to the terminals ct10, ct11, ct12, ct17 and ctho. The NAND gate circuit NA10 connected to the unit counter of the final stage in the counter works to automatically discontinue the operation of the power source initializing circuit. That is, the output of the NAND gate circuit NA10 is changed from the high level to the low level after a predetermined counting operation to halt the operation of the controlled-type self-excited oscillation circuit OSCC.

In the power source initializing circuit VINTC, the output intgb of the inverter circuit IV3 is maintained at the high level while the power source initializing circuit VINTC is in operation, i.e., maintained at the high level from when the control input intpu assumes the high level until when the output of the NAND gate circuit NA10 assumes the low level. The signal intgb which can be substantially regarded to be a power source initializing operation instruction signal is supplied to the circuit of FIG. 8 or as a control signal for controlling the change between the internal signal of the dynamic memory and the external signal.

When the control signal intpu that is input is of the low level, the power source initializing circuit VINTC is brought into a halt correspondingly. In the state where the operation is halted, the counter is reset by the output from the inverter circuit IV7 supplied to the reset terminal r in the unit counter of each of the stages to assume the state of low power consumption. The power source initializing circuit VINTC that operates as described above can be regarded to be the initial clock-generating circuit as described above.

The oscillation signal from the oscillation circuit oscc output from the terminal osc of the power source initializing circuit VINTC is supplied as an operating-clock signal of the memory to the reference clock-generating circuit in the global control circuit of FIG. 25. The count signals output to the terminals ct10, ct11, ct12, ct17 and ctho are supplied as bank activating signals to the corresponding terminals of the global control circuit of FIG. 25. The global control circuit changes over the external signal and the internal signal in response to the control signal intgb as described earlier. Then, the dynamic memory DRAM executes the known periodic operation in a state where there is no external signal.

Due to the periodic operation, the power source of the internal circuit is stabilized and the precharging is initialized. That is, prior to starting the initializing operation, the individual bit lines in the memory cell array are not necessarily assuming the state of a steady level. Due to the initializing operation, therefore, the bit lines are precharged, the memory cells are selected, and the potential is imparted to the bit lines by the operation of the sense amplifier, all periodically and repetitively, so that the bit lines gradually assume the state of a steady level.

The plate electrodes which are common electrodes of the data storage capacities in the plurality of memory cells should be assuming a steady level of nearly onehalf the power source voltage but are not necessarily assuming the steady level before the initializing operation. Further, the substrate bias voltage applied to the P-type well region pwelll (see FIG. 15) constituting the memory cell array is not necessarily assuming a steady level before the initializing operation. The plate electrode potential and the substrate bias voltage distinctly acquire steady levels through the initializing operation.

The power source initializing operation is executed based on the sequential control. That is, based on a variety of pulse signals output from the power source initializing circuit shown in FIG. 23, the power source initializing operation acquires a stabilization control cycle of a predetermined period of time like, for example, 200 microseconds or within 200 cycles as represented by the operation sequence period and signal waveform shown in FIGS. 27 and 28. The internal nodes of the circuit are initialized and the power source level is stabilized or is set within the cycles. Thus, the power source initialization control can be effected after a predetermined wait time as viewed from the system LSI, i.e., as viewed from the semiconductor integrated circuit of the embodimqqt, making it easy to control the system.

Figure 29:
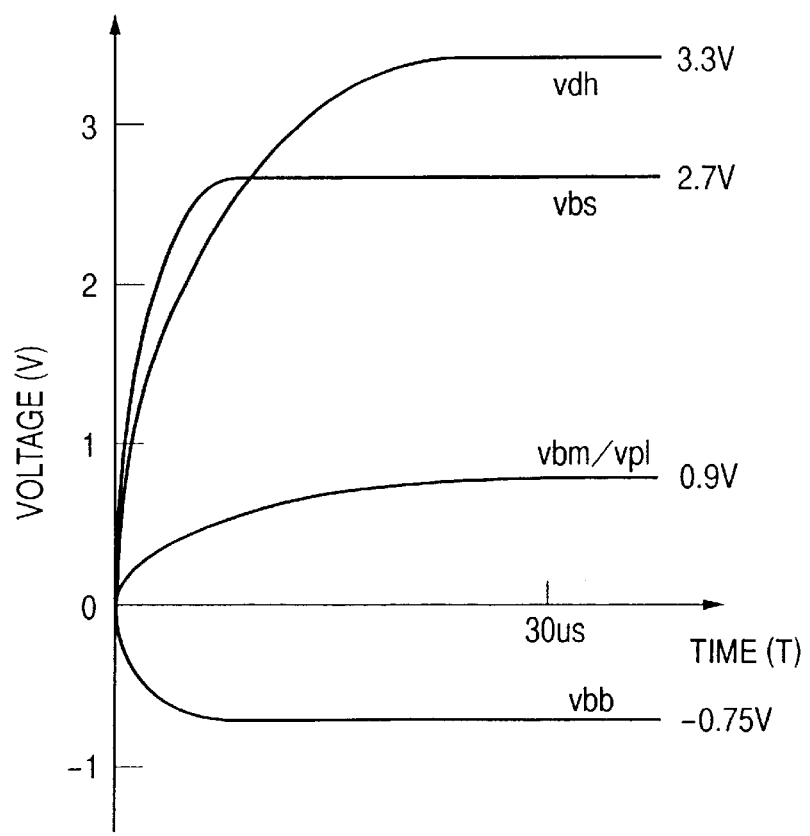
FIG. 29 is a diagram of voltage waveforms in the dynamic memory of FIG. 8.

FIG. 29 illustrates changes in the internal power source voltage levels with the passage of time or changes in the saturation with the passage of time in the case where the power source is supplied to the dynamic memory DRAM which is a functional unit or a module serving as a load to the power source.

In FIG. 29, vdh denotes a power source voltage for driving the word lines in the memory cell array, vbs denotes a power source voltage applied to the bit lines, vbm and vpl denote the above-mentioned bit line-precharging voltage and the plate voltage, and Vbb denotes a substrate bias given to the P-type well region of the above-mentioned memory cell array. The power source voltage vdd for the main circuit in the semiconductor integrated circuit device is, for example, 1.8 volts, which is a standard value, vdh is 3.3 volts, vbs is 2.7 volts and vbb is −0.75 volts. The voltages vbm and vpl are 0.9 volts. The drawing should be comprehended to illustrate typical changes, and a time of about 30 microseconds is needed until the power source voltage reaches saturation.

The above-mentioned power source initializing circuit VINTC initializes the operation over a period in excess of the above-mentioned period. This makes it possible to maintain a predetermined level. It is desired that the initializing operation period or the setpoint period of the power source initializing circuit VINTC is several times as long as the period shown in FIG. 29 by taking into consideration the worst environmental conditions such as the operation temperature, etc. of the semiconductor integrated circuit device.

(Modified Embodiment)

The above-mentioned embodiment can be modified without departing from the spirit and scope of the invention. For instance, the pulse-generating circuit PGC in the substrate bias control circuit VBBC shown in FIG. 2 can be constituted by a circuit comprising chiefly a frequency-dividing circuit that receives the external clock signals clk as frequency-dividing pulses or by a circuit comprising chiefly a selfexcited oscillation circuit such as ring oscillator. Such a substitute constitution is effective in generating pulse signals of a frequency very much lower than the frequency of the external clock signals clk. That is, when the external clock signals clk of a high frequency are used to meet the system requirement, the operation frequency of the pulse-generating circuit PGC can be lowered irrespective of the external clock signals clk, and the consumption of electric power can be decreased.

The substrate bias control circuit VBBC shown in FIGS. 1 and 2 may be separated from the semiconductor integrated circuit device of FIG. 1, and may be constituted as a power source control circuit on a mounted member such as printed wiring board constituting the electronic system or as a semiconductor integrated circuit device separate from the semiconductor integrated circuit device of FIG. 1. In this case, an increased number of external terminals are required for the substrate bias system of the semiconductor integrated circuit device of FIG. 1. However, it is possible to control the operation of the substrate bias control circuit VBBC independently of the operation of the semiconductor integrated circuit device, which is preferred for controlling the electronic system. Further, the register circuit is not limited to the latch constitution such as a flip-flop circuit provided it is capable of holding data.

The shallow substrate bias voltage state does not mean a single bias voltage state only. When the dynamic memory DRAM has a small storage capacity and permitting the refreshing operation maintaining a relatively long period, the shallow substrate bias voltage for the dynamic memory DRAM may be nearly at a level of the power source voltage vdd, may be at a level higher than the power source voltage vdd which lies between the level of the reference potential vss and the level of the deep substrate bias voltage state, or may be at a level not higher than the reference potential vss. In this case, to the dynamic memory are applied the shallowest substrate bias voltage state or the first substrate bias voltage state that corresponds to the normal operation mode of the semiconductor integrated circuit device, and the slightly shallow substrate bias voltage state or the second substrate bias voltage state corresponding to the operation standby mode.

Similarly, the deep substrate bias voltage state does not necessarily mean a state in which the CMOS static circuit does not permit the signal to change. In this case, the CMOS static circuit may operate at a low speed. It is needless to say that the refreshing operation is effected even in the normal operation mode (first mode).

The constitution of the dynamic memory can be changed. In the constitution in which the substrate bias switching circuit VBBM is included as a functional unit or a module in the dynamic memory as shown in FIG. 8, the external terminals of the unit need not include the terminals for the signals such as control signals bbcz that have a meaning only in the functional unit or the module, offering an advantage in regard to facilitating the module management in a sense of design. As required, however, the substrate bias switching circuit VBBM may be provided outside the dynamic memory being constituted integrally with, for example, the substrate bias control circuit VBBC.

Figure 30:
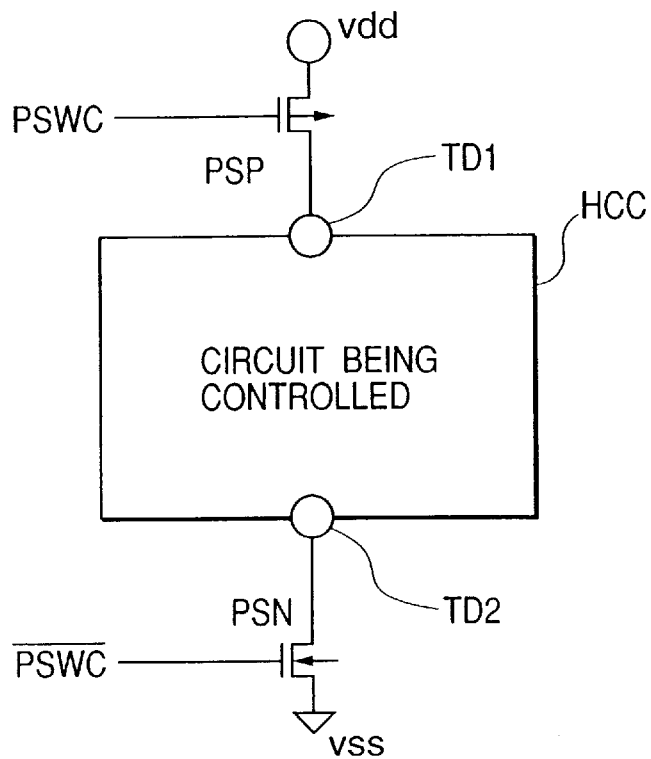
FIG. 30 is a diagram illustrating a power switching circuit for controlling the power switch for the modules in the system LSI.

The concrete control system for the modules which are to be controlled for their power, were described above concerning chiefly clock control for controlling the supply/non-supply of clock signals and concerning chiefly substrate bias control for controlling the substrate bias potential for each of the modes (first mode, second mode and third mode). The present invention, however, is in no way limited thereto but may employ a power switch control by power switching circuits PSP, PSN provided between the power source terminals TD1, TD2 of the module (circuit HCC being controlled) that is to be controlled for its power and the terminals served with the power source voltage vdd and ground voltage vss as shown in FIG. 30.

Figure 31:
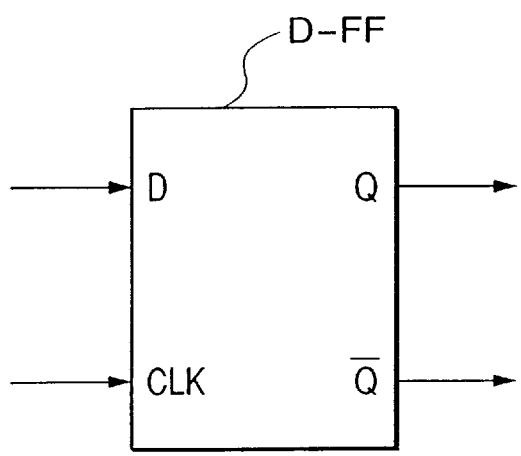
FIG. 31 is a diagram of a D-type flip-flop D-FF constituted by CMOS.

FIG. 31 illustrates a D-type flip-flop D-FF constituted by CMOS. The D-type flip-flop receives the data through the input terminal D upon being served with a clock signal CLK through the clock terminal C, outputs the received data from the output terminal Q1, and outputs the inverted signal of the received signal from the output terminal Q2. When the clock signal CLK is not supplied (second mode, third mode) due to the clock control corresponding to the above modes (first mode, second mode, third mode), the D-type flip-flop does not receive new data from the terminal D, and almost no electric power is consumed.

The D-type flip-flop is constituted by the static CMOS latch circuit and, hence, the data now being held is output at the output terminals Q1 and Q2 without consuming electric power. In other words, without supplying clock signal CLK, the data being held by the flip-flop is not updated; i.e., the flipflop consumes small amounts of electric power.

The semiconductor integrated circuit device sets a plurality of operation control signals and, hence, sets a plurality of modes such as a normal operation mode, a standby mode and an operation standby mode for continuing the operations of some circuits including the memory. Thus, there is obtained a semiconductor integrated circuit device featuring diversified operation controls and which is suited for use as a system LSI.

A plurality of modes are set upon setting a plurality of operation control signals, and the control operation toward the plurality of modes can be simplified by setting independent control functions for each of the plurality of operation control signals. Thus, there is obtained a semiconductor integrated circuit device which is capable of executing fine operation control for decreasing the consumption of electric power.

The CMOS substrate bias control technology adapted to the plurality of operation modes makes it possible to obtain a semiconductor integrated circuit device that consumes decreased amounts of electric power and is suited for use as a system LSI.

Upon constituting the substrate bias control circuit as a functional unit or a module, there is obtained a semiconductor integrated circuit device that can be easily constituted as a system LSI comprising a plurality of functional units or modules.

There is obtained a dynamic memory capable of holding data in a state of consuming small amounts of electrical power and in a de-energized state as a functional unit or a module adapted to diversifying the system LSI.

The refreshing operation for reliably holding the data is made possible owing to control technology for placing the DRAM module in the operation standby state prior to acquiring the sleeping state in a standby state where the system LSI is sleeping.

When the DRAM module is completely in the standby state together with the system, a deep substrate bias is applied to both nMOSs and pMOSs to cut the sub-threshold leakage current of nMOSs and pMOSs to a sufficient degree, thereby to further decrease the wasteful consumption of electric power.

When a shallow substrate bias is applied, the sub-threshold current is as large as about 1 mA or more even under the complete standby state (third mode) of the system LSI, e.g., even under the state where the system clock signals are not supplied (system is halted), and the cell (battery)-powered portable terminal system cannot be used for extended periods of time without renewing the cell. When a deep substrate bias is applied, on the other hand, the sub-threshold current becomes as very small as about 10 to 100 $\mu A$ under the same halted state. In this case, the consumption current of the substrate bias-generating circuit that is in operation of the system LSI is about from 10 to 100 nA, which is a reduction in the consumption current down to about one-hundredth compared to the current flowing into the whole LSI.

When the internal X-system/Y-system circuits are controlled in a divided manner in the DRAM module, the current can be decreased compared with when the module as a whole is controlled. The substrate bias switching control circuit constitution described with reference to FIGS. 12 and 19, i.e., the constitution in which the wires for switching the substrate bias and the switching MOSs are arranged not in a well but outside the substrate bias switching control circuit, makes it possible to change the layout for biases only. Therefore, the circuit constitution can be easily and automatically laid out, thereby facilitating the verification.

Upon automatically effecting the internal initialization, the internal power source voltage can be raised and lowered within a predetermined period of times irrespective of the input cycle from the external unit without being affected by the input clocks. Therefore, the design is facilitated and A decreased burden is born on the system control logic.

What is claimed is:

1. A semiconductor integrated circuit device comprising a first circuit block having a data processing circuit, a second circuit block having a dynamic memory, and a bus coupling said first circuit block and said second circuit block together, all being formed on a single substrate, and further comprising:

a first mode for placing said first circuit block and said second circuit block in an energized state;

a second mode for placing said first circuit block and said second circuit block in de-energized state; and a third mode for placing said first circuit block in the de-energized state and for placing said second circuit block in the energized state to avoid loss of data stored in said dynamic memory.

2. A semiconductor integrated circuit device according to claim 1, further comprising a control circuit which forms a first internal control signal for setting said second mode and a second internal control signal for setting said third mode based on a plurality of control signals supplied from a unit outside said semiconductor integrated circuit device.

3. A semiconductor integrated circuit device according to claim 2, wherein said control circuit includes a signal-forming circuit that produces mode instruction signals for instructing said first mode, said second mode and said third mode based on said first internal control signal and said second internal control signal.

4. A semiconductor integrated circuit device according to claim 3, wherein said first circuit block and said second circuit block are constituted by a plurality of insulated-gate field-effect transistors, respectively, and said semiconductor integrated circuit device includes a substrate bias control circuit that controls the substrate gate potential of said plurality of insulated-gate field-effect transistors depending upon said first mode, said second mode and said third mode.

5. A semiconductor integrated circuit device according to claim 3 or 4, further comprising a clock-generating circuit for generating internal clock signals depending on said energized state and said de-energized state.

6. A semiconductor integrated circuit device according to claim 5, further comprising a first wiring for coupling said substrate bias control circuit and said first and second circuit blocks together, said first wiring including a substrate bias potential line for supplying a substrate bias potential to control said substrate gate potential and a signal line for supplying a plurality of control signals to said first and second circuit blocks for setting said first, second and third modes.

7. A semiconductor integrated circuit device according to claim 6, wherein:

in said first mode, said plurality of insulated-gate field-effect transistors in said first circuit block and in said second circuit block are served, through said first wiring, with a first substrate bias potential from said substrate bias control circuit to set the threshold voltage of said transistors to be a relatively small voltage;

in said second mode, said plurality of insulated-gate field-effect transistors in said first circuit block and in said second circuit block are served, through said first wiring, with a second substrate bias potential from said substrate bias control circuit to set the threshold voltage of said transistors to be a relatively large value; and in said third mode, said plurality of insulated-gate field-effect transistors in said first circuit block are served, through said first wiring, with said first substrate bias potential from said substrate bias control circuit to set the threshold voltage of said transistors to be a relatively small voltage, and said plurality of insulated-gate field-effect transistors in said second circuit block are served, through said first wiring, with said second substrate bias potential from said substrate bias control circuit to set the threshold voltage of said is transistors to be a relatively large voltage.

8. A semiconductor integrated circuit device according to claim 7, wherein said dynamic memory includes a memory cell array in which memory cells for storing data are arranged in the form of a matrix, a row decoder and a column switch for selecting the memory cells, a sense amplifier for amplifying the data read out from the selected memory cells, and a memory input/output circuit coupled to said bus.

9. A semiconductor integrated circuit device according to claim 4, wherein said dynamic memory comprises a memory module that includes a memory control circuit, and said memory module further includes a substrate bias switching circuit which is served with said substrate bias potential from said substrate bias control circuit through said first wiring, and selectively supplies said first and second substrate bias potentials to the circuits in said memory module depending on the state of the third internal control signal formed based on said first internal control signal and said second internal control signal.

10. A semiconductor integrated circuit device according to claim 9, wherein said memory module includes a power source initializing circuit, and said power source initializing circuit includes a pusle-generating circuit that generates a pulse signal for a predetermined period of time depending on an initialization control signal supplied from said memory control circuit.

11. A semiconductor integrated circuit device according to claim 10, wherein said sense amplifier is operated by said pulse signal to amplify the data read out from said dynamic memory.

* * * * *